(12) United States Patent
Chew et al.

(10) Patent No.: US 9,120,169 B2
(45) Date of Patent: Sep. 1, 2015

(54) METHOD FOR DEVICE PACKAGING

(75) Inventors: Hwee Seng Chew, Singapore (SG); Chee Kian Ong, Singapore (SG); Kian Hock Lim, Singapore (SG); Amlan Sen, Singapore (SG); Shoa Siong Lim, Singapore (SG)

(73) Assignee: ORION SYSTEMS INTEGRATION PTE LTD, Singapore (SG)

( * ) Notice: Subject to any disclaimer, the term of this patent is extended or adjusted under 35 U.S.C. 154(b) by 847 days.

(21) Appl. No.: 13/128,141

(22) PCT Filed: Nov. 9, 2009

(86) PCT No.: PCT/SG2009/000413
§ 371 (c)(1),
(2), (4) Date: Aug. 9, 2011

(87) PCT Pub. No.: WO2010/053454
PCT Pub. Date: May 14, 2010

(65) Prior Publication Data
US 2011/0287560 A1    Nov. 24, 2011

(30) Foreign Application Priority Data

Nov. 7, 2008    (SG) .............................. 200808314-9

(51) Int. Cl.
*H01L 21/66*    (2006.01)
*B23K 1/00*    (2006.01)
(Continued)

(52) U.S. Cl.
CPC .............. *B23K 1/0016* (2013.01); *B23K 1/203* (2013.01); *H01L 24/75* (2013.01); *H01L 24/81* (2013.01); *B23K 2201/40* (2013.01); *H01L 21/683* (2013.01); *H01L 21/6838* (2013.01); *H01L 21/68707* (2013.01); *H01L 24/13* (2013.01); *H01L 24/16* (2013.01); *H01L 24/29* (2013.01); *H01L 24/83* (2013.01); *H01L 2221/68354* (2013.01); *H01L 2224/131* (2013.01); *H01L 2224/1308* (2013.01);
(Continued)

(58) Field of Classification Search
CPC ..... H01L 21/00; H01L 21/50; H01L 21/4763; H01L 21/48
USPC ...................... 438/15; 29/25.01; 257/E21.499
See application file for complete search history.

(56) References Cited

U.S. PATENT DOCUMENTS 4,710,798 A * 12/1987 Marcantonio ................. 257/777
7,595,228 B2 * 9/2009 Abe et al. ...................... 438/123
(Continued)

*Primary Examiner* — Caleb Henry
(74) *Attorney, Agent, or Firm* — Pillsbury Winthrop Shaw Pittman, LLP

(57) ABSTRACT

A method for fabricating a flip-chip semiconductor package. The method comprises processing a semiconductor device, for example a semiconductor chip and processing a device carrier, for example a substrate. The semiconductor device comprises bump structures formed on a surface thereof. The substrate comprises bond pads formed on a surface thereof. Processing of the semiconductor chip results in heating of the semiconductor chip to a chip process temperature. The chip process temperature melts solder portions on the bump structures Processing of the substrate results in heating of the substrate to a substrate process temperature. The method comprises spatially aligning the semiconductor chip in relation to the substrate to correspondingly align the bump structures in relation to the bump pads. The semiconductor chip is then displaced towards the substrate for abutting the bump structures of the semiconductor chip with the bond pads of the substrate to thereby form bonds therebetween. A system for performing the above method is also disclosed.

17 Claims, 26 Drawing Sheets

(51) Int. Cl.
*B23K 1/20* (2006.01)
*H01L 21/683* (2006.01)
*H01L 21/687* (2006.01)
*H01L 23/00* (2006.01)

(52) U.S. Cl.
CPC ............... *H01L 2224/13082* (2013.01); *H01L 2224/13111* (2013.01); *H01L 2224/13139* (2013.01); *H01L 2224/16225* (2013.01); *H01L 2224/16245* (2013.01); *H01L 2224/2919* (2013.01); *H01L 2224/73204* (2013.01); *H01L 2224/755* (2013.01); *H01L 2224/757* (2013.01); *H01L 2224/7515* (2013.01); *H01L 2224/7525* (2013.01); *H01L 2224/7565* (2013.01); *H01L 2224/75251* (2013.01); *H01L 2224/75501* (2013.01); *H01L 2224/75701* (2013.01); *H01L 2224/75702* (2013.01); *H01L 2224/75704* (2013.01); *H01L 2224/75705* (2013.01); *H01L 2224/75744* (2013.01); *H01L 2224/75745* (2013.01); *H01L 2224/75753* (2013.01); *H01L 2224/75802* (2013.01); *H01L 2224/75804* (2013.01); *H01L 2224/75822* (2013.01); *H01L 2224/75824* (2013.01); *H01L 2224/8115* (2013.01); *H01L 2224/8116* (2013.01); *H01L 2224/8117* (2013.01); *H01L 2224/8118* (2013.01); *H01L 2224/81024* (2013.01); *H01L 2224/81048* (2013.01); *H01L 2224/81121* (2013.01); *H01L 2224/81191* (2013.01); *H01L 2224/81204* (2013.01); *H01L 2224/81815* (2013.01); *H01L 2224/8385* (2013.01); *H01L 2224/83192* (2013.01); *H01L 2924/00013* (2013.01); *H01L 2924/014* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01046* (2013.01); *H01L 2924/01047* (2013.01); *H01L 2924/01072* (2013.01); *H01L 2924/01078* (2013.01); *H01L 2924/01079* (2013.01); *H01L 2924/01082* (2013.01); *H01L 2924/3511* (2013.01); *H01L 2924/381* (2013.01); *H01L 2924/3841* (2013.01); *Y10T 29/41* (2015.01)

(56) References Cited

U.S. PATENT DOCUMENTS

| | | | |
|---|---|---|---|
| 8,174,128 B2 * | 5/2012 | Ikeguchi et al. | 257/778 |
| 2006/0051895 A1 * | 3/2006 | Abe et al. | 438/108 |

* cited by examiner

Step 210: Providing a semiconductor chip

Step 220: Transferring semiconductor chip from chip tray to chip pickup tool

Step 230: Orientating and positioning semiconductor chip

Step 240: Placing semiconductor chip on chip preheat stage

Step 250: Preheating semiconductor chip

Step 260: Picking up of semiconductor chip by bond tool

Step 270: Heating of semiconductor chip to bonding temperature

Step 280: Positioning of semiconductor chip to bonding temperature

Step 310: Providing the substrate

Step 320: Transferring substrate to flux stage

Step 330: Transferring flux onto surface of substrate

Step 340: Transferring substrate to substrate preheat stage

Step 350: Heating substrate to transition temperature

Transition
temperature

Step 360: Transferring substrate from substrate preheat stage to bond stage

Step 370: Heating substrate to second bonding temperature

Step 380: Measuring thickness of the substrate

Step 390: Positioning of the substrate below second vision lens

Step 410: Dispensing Flux onto flux transfer stage

Step 420: Pressing tampon tool onto flux for pickup flux thereby

Step 430: Aligning tampon tool above the substrate

Step 440: Pressing the tampon tool onto surface of substrate

Step 450: Transfer of flux from tampon tool to the surface of the substrate

Step 510: Positioning of semiconductor chip relative substrate

Steps 520 and 530: First and second phase movement of the bond tool

Steps 540 and 550: Positioning and maintaining the semiconductor chip and the substrate at a bonding position Steps 560: Releasing the semiconductor chip onto the substrate Actual Stroke = Hr − Hs − Hd + Compression offset*

*Compression offset is to overcome any co-planarity variances from the Die and the Substrate

METHOD FOR DEVICE PACKAGING

CROSS-REFERENCE TO RELATED APPLICATIONS

This application is a National Stage of PCT/SG2009/000413, filed Nov. 9, 2009, which claims the benefit and priority of Singapore Application No. 200808314-9, filed Nov. 7, 2008. The foregoing applications are incorporated herein in its entirety by reference.

FIELD OF INVENTION

The present invention relates generally to a method for packing semiconductor components or devices. More specifically, the present invention relates to a method for fabricating a flip-chip semiconductor package.

BACKGROUND

Semiconductor packaging typically involves encapsulating or housing a semiconductor component or device, for example a semiconductor chip, within a device carrier or substrate. The device carrier or substrate supports the semiconductor chip and facilitates a convenient handling of the semiconductor chip. In addition, the device carrier comprises external connections or terminals for electrically connecting the semiconductor chip to an external circuit.

A known method of semiconductor packaging, more specifically a method of forming a flip-chip on leadframe (FCOL) semiconductor package, employs a plated leadframe. A leadframe is a patterned sheet of metal. The sheet of metal, which is typically copper, is commonly plated with one of silver, nickel or palladium. Plating is necessary to prevent the sheet of metal from oxidizing, and to provide a surface onto which solder will adhere or, when employing wire bonding, gold or aluminum can be bonded. The pattern of the sheet of metal provides a leadframe for forming the FCOL semiconductor package.

Typically, leadframes for forming FCOL semiconductor packages have leads with inner lead portions and outer lead portions. The inner lead portions are arranged in a pattern with interconnect locations on the inner lead portions matching pattern of pads formed on a surface of the semiconductor chip. Solder bumps or balls are deposited on the pads formed on the surface of the semiconductor chip. Reflow of the solder bumps facilitates bonding of the pads of the semiconductor chip with the leadframe, more specifically with the interconnect locations on the inner lead portions of the leadframe.

The semiconductor chip is then placed on the leadframe with the pads of the semiconductor chip abutting the interconnect locations on the inner lead portions of the leadframe. Assembly of the semiconductor chip and the leadframe is then heated to an elevated temperature to reflow the solder bumps for forming solder interconnects between the semiconductor chip and the leadframe. The heating of the assembly is typically performed in a heating chamber or oven. The resultant semiconductor package formed is known in the art as the FCOL semiconductor package.

Current heating processes for reflowing the solder bumps as described above have been considered to be significantly time consuming, thereby impairing fabrication or manufacturing efficiency and throughput of semiconductor packages.

In addition, coefficient of thermal expansion (CTE) of the semiconductor chips generally differs from CTE of the leadframes or other substrates. Accordingly, differential expansion occurs between the semiconductor chip and the leadframe when the assembly of the semiconductor chip and the leadframe is heated. The differential expansion between the semiconductor chip and the leadframe can cause mis-alignments between the solder bumps on the pads of the semiconductor chips and the solder bumps on the inner lead portions of the leadframe, thereby resulting in impaired or malfunctioning solder interconnects between the semiconductor chip and the leadframe. Such mis-alignments and impaired solder interconnections are especially prevalent with semiconductor chips or packages having a fine pitch.

The increasing functionality, speed and portability of modern electronic devices have resulted in an increasing need for more electronic components or elements to be integrated into the semiconductor chip. Accordingly, reduction of the pitch or distance between adjacent pads or electrical interconnects, and between the solder bumps formed thereon, of the semiconductor chip is increasingly important in the semiconductor industry.

However, the reduced pitch or distance between pads or electrical interconnects of the semiconductor chip increases risk, and occurrences, of bridging between the adjacent pads or electrical interconnects, thereby resulting in electrical shorting.

Correspondingly, the increased risk, and occurrences, of electrical shorting between adjacent pads or electrical interconnects adversely affects the reliability and quality of the fabricated semiconductor packages.

Accordingly, a person skilled in the art will appreciate that an improved method for fabricating flip-chip semiconductor packages capable of addressing at least one of the above-identified issues is needed.

SUMMARY

The present invention provides an exemplary method for semiconductor component or device packaging for addressing at least one of the above-identified issues.

In accordance with a first aspect of the present invention, there is disclosed a method for device packaging, the method comprising heating a semiconductor device to a first temperature. The semiconductor device comprises a plurality of bump structures, each of the plurality of bump structures comprising a solder portion. The first temperature is at least the melting temperature of the solder portion of each of the plurality of bump structures. The method further comprises heating a substrate to a second temperature, the substrate comprising a plurality of contact pads and spatially aligning, through the use of an alignment means, the plurality of bump structures with the plurality of contact pads subsequent the heating of the semiconductor device and the substrate. The semiconductor device is disposed away from the substrate during heating of the semiconductor device to the first temperature and at least one of the semiconductor device and the substrate is subsequently displaceable towards the other thereof for abutting each of the plurality of bump structures with a corresponding one of the plurality of contact pads.

In accordance with a second aspect of the present invention, there is disclosed a system for packaging a device, the system comprising means for heating a semiconductor device to a first temperature. The semiconductor device comprises a plurality of bump structures, each of the plurality of bump structures comprising a solder portion. The first temperature is at least a melting temperature of the solder portion of each of the plurality of bump structures. The system further comprises means for heating a substrate to a second temperature, the substrate having a plurality of contact pads. The system further comprises an alignment means for spatially aligning the plurality of bump structures with the plurality of contact pads subsequent the heating of the semiconductor device and the substrate. The semiconductor device is disposed away from the substrate during heating of the semiconductor device to the first temperature. Heating of the semiconductor device to the first temperature enables the solder portions to reach melting point for being at a molten phase. The at least one of the semiconductor device and the substrate is subsequently displaceable towards the other thereof for abutting each of the plurality of bump structures with a corresponding one of the plurality of contact pads. Thickness of at least one of the semiconductor device and the substrate is calibrated for controlling displacement of the at least one of the semiconductor device and the substrate towards the other thereof.

BRIEF DESCRIPTION OF DRAWINGS

Exemplary embodiments of the present invention are described hereinafter with reference to the following drawings, in which.

DETAILED DESCRIPTION

Existing methods for fabricating flip-chip semiconductor packages typically position solder bumps formed on pads or pillars of a semiconductor chip onto contact pads formed on a device carrier (for example a substrate) before heating the assembly of the semiconductor chip and device carrier to reflow the solder bumps and form solder interconnects between the semiconductor chip and the device carrier. This heating process is typically time-consuming, thereby adversely affecting fabrication or manufacturing efficiency and throughput of the flip-chip semiconductor packages. Existing methods also commonly involve use of considerable force for abutting the pads of the semiconductor chip with the contact pads of the device carrier in order to create a reliable solder joint. Accordingly, the considerable force used can result in damage to the semiconductor chip or device carrier during heating thereof. In addition, existing methods for fabricating flip-chip semiconductor packages have been associated with a problem of electrical shorting between adjacent interconnects formed between semiconductor chips and device carriers. This problem of electrical shorting between adjacent interconnects is especially prevalent with semiconductor chips and packages having a fine pitch. Furthermore, an accurate positioning or alignment of the semiconductor chip in relation to the device carrier during formation of interconnects or solder interconnects therebetween can also be difficult to achieve. Accordingly, the present invention provides an improved method for packaging semiconductor devices, more specifically an improved method for fabricating semiconductor flip-chip packages, which is capable of addressing at least one of the above-identified problems.

For purposes of brevity and clarity, the description of embodiments of the present invention provided hereinafter is limited to methods for fabricating or manufacturing a flip-chip semiconductor package. It will however be understood by a person skilled in the art that this does not preclude the present invention from other applications where fundamental principles prevalent among the various embodiments of the present invention such as operational, functional or performance characteristics are required.

Figure 1:
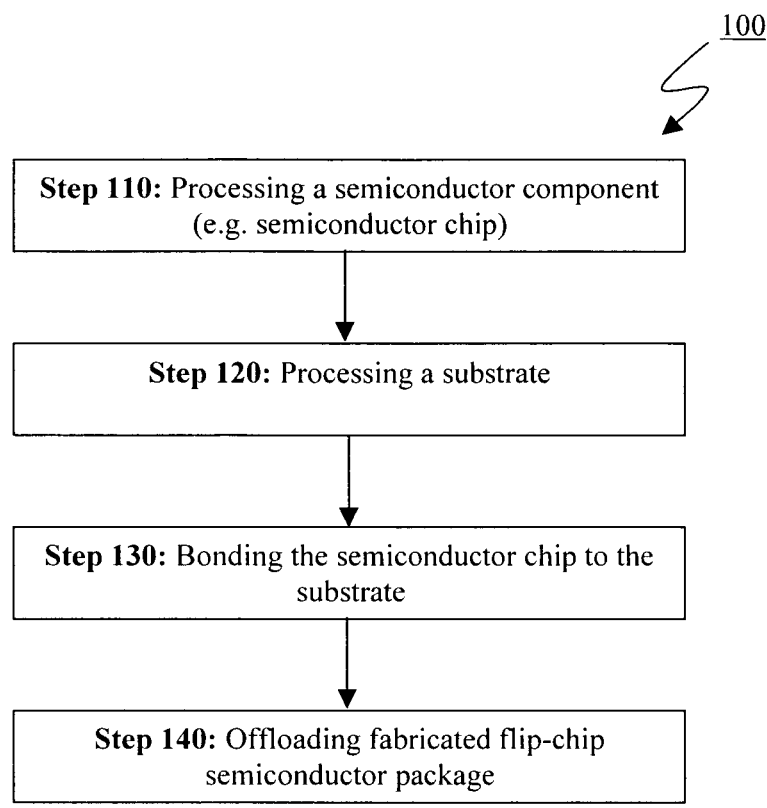
FIG. 1 is a partial method flow diagram of an exemplary method for fabricating a flip-chip semiconductor package according to an embodiment of the present invention.

An exemplary method 100 for fabricating a flip-chip semiconductor package 10 is provided according to an embodiment of the present invention. A method flow diagram of the exemplary method 100 is shown in FIG. 1.

In a step 110 of the exemplary method 100, a semiconductor device or component is processed. The semiconductor device is for example, and will hereinafter be referred to as a semiconductor chip 12.

Figure 2:
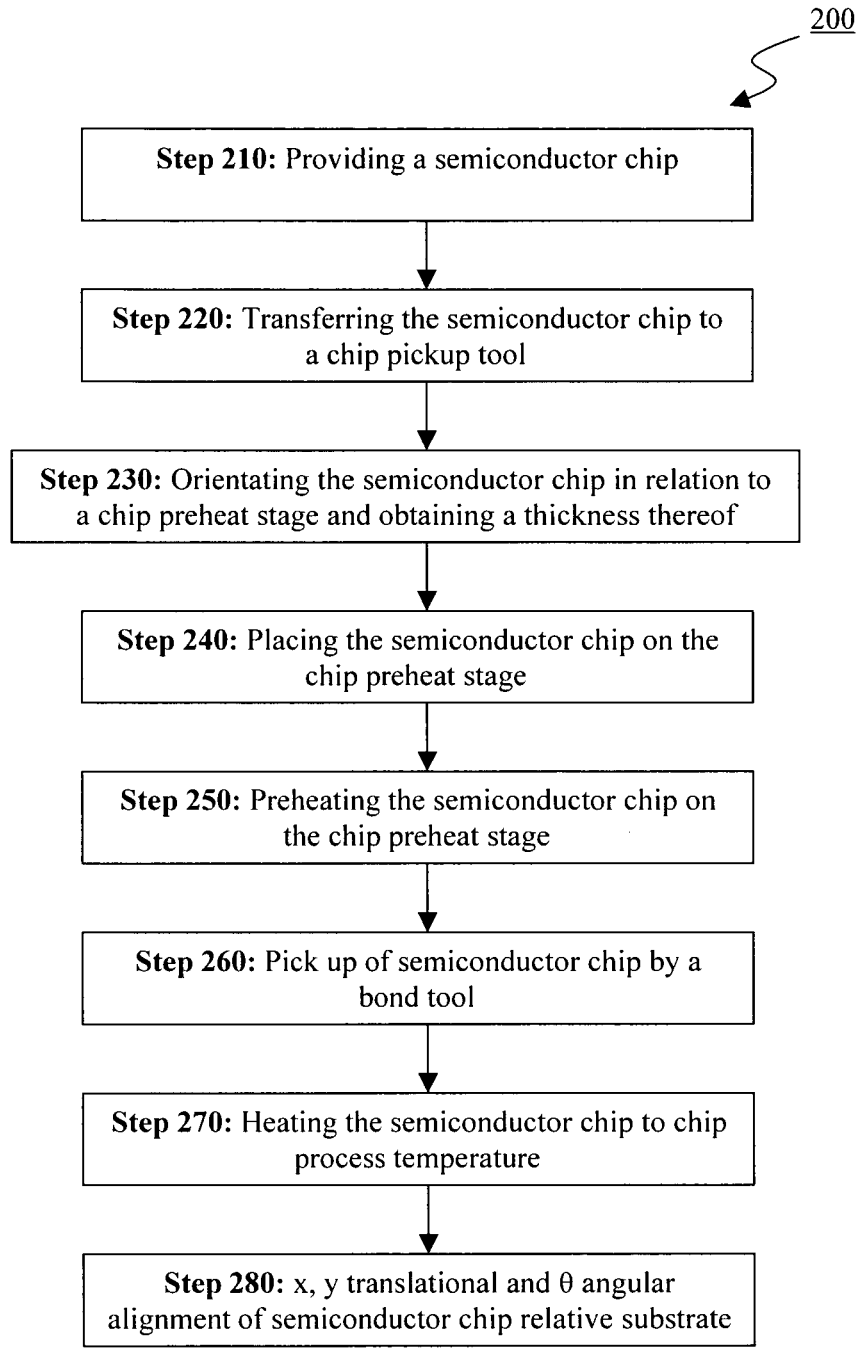
FIG. 2 is a partial process flow diagram of an exemplary semiconductor chip processing process performed in a step of the exemplary method of FIG. 1.
Figure 3A:
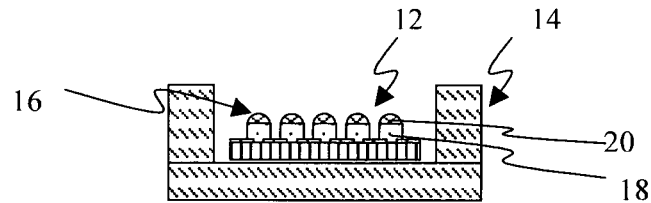
FIGS. 3a to 3h illustrates the steps of the exemplary semiconductor chip processing process of FIG. 2.
Figure 3B:
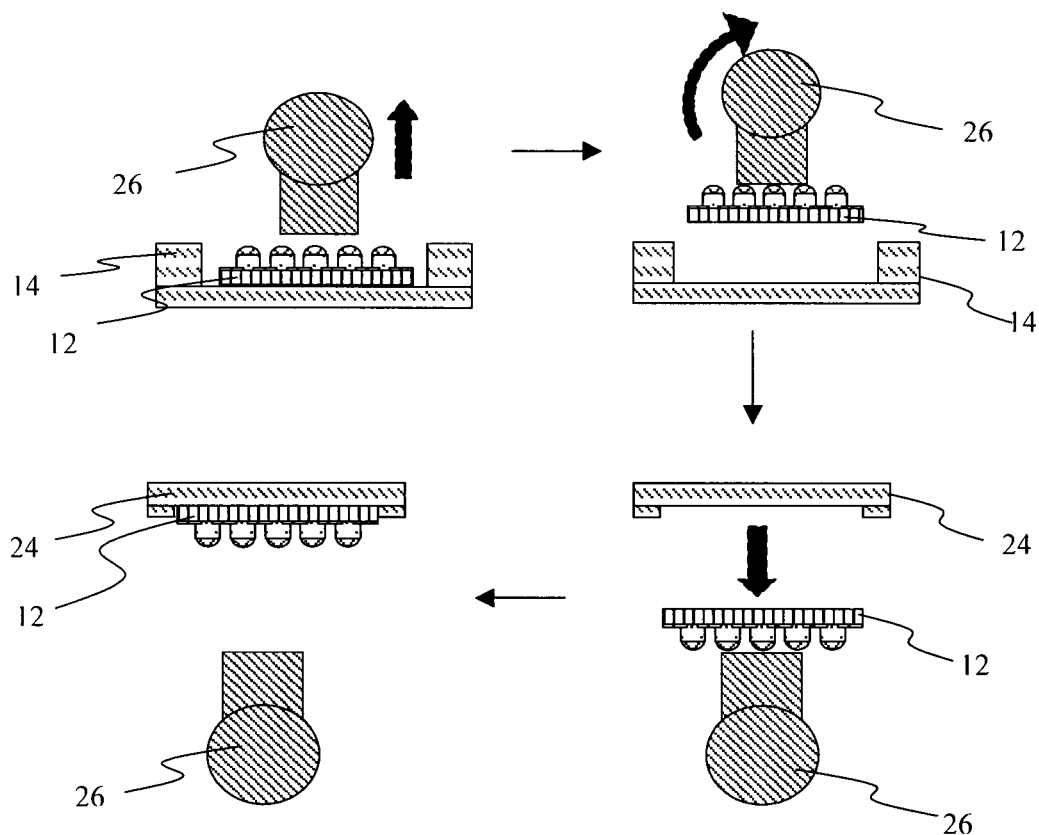
Figure 3C:
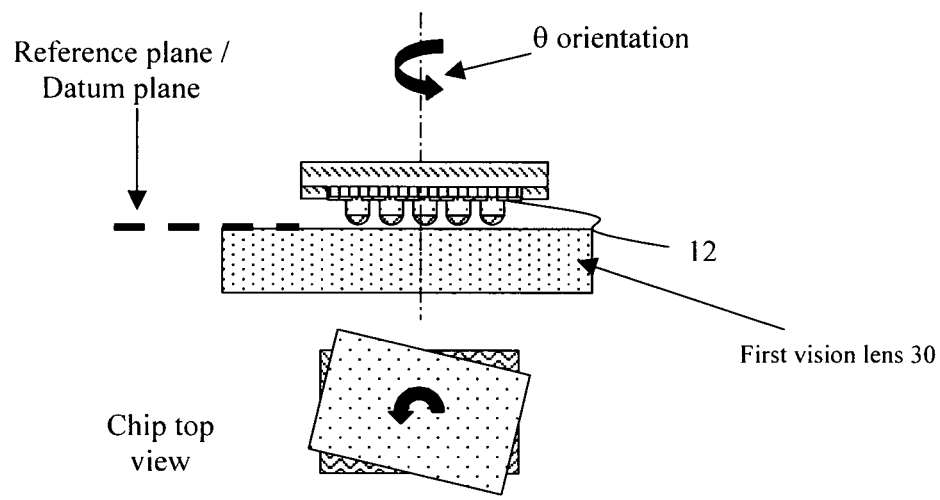
Figure 3D:
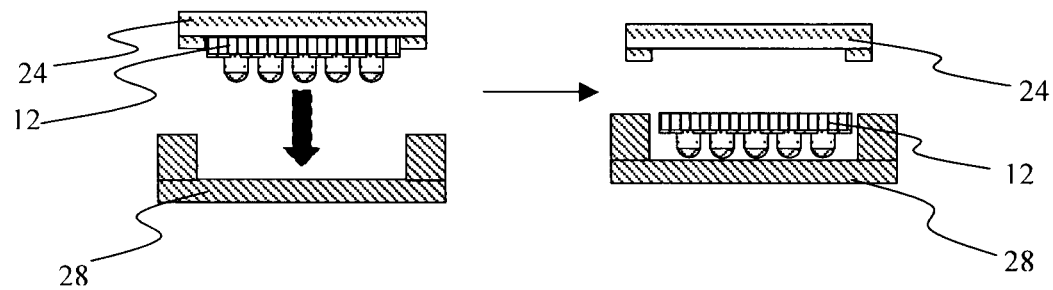
Figure 3E:
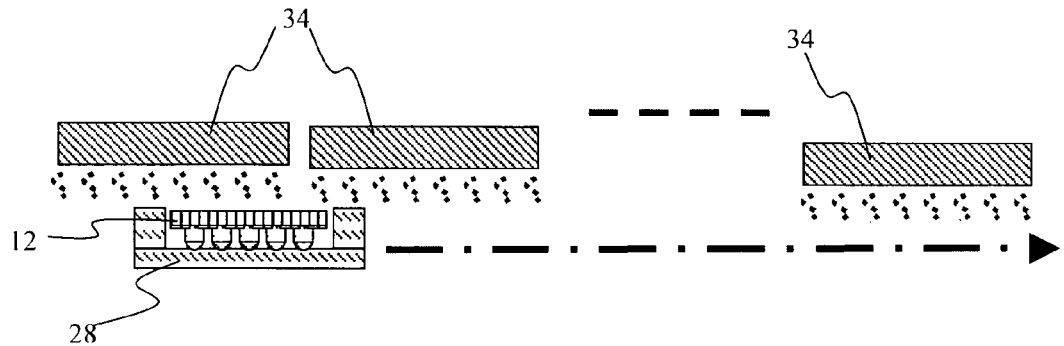
Figure 3F:
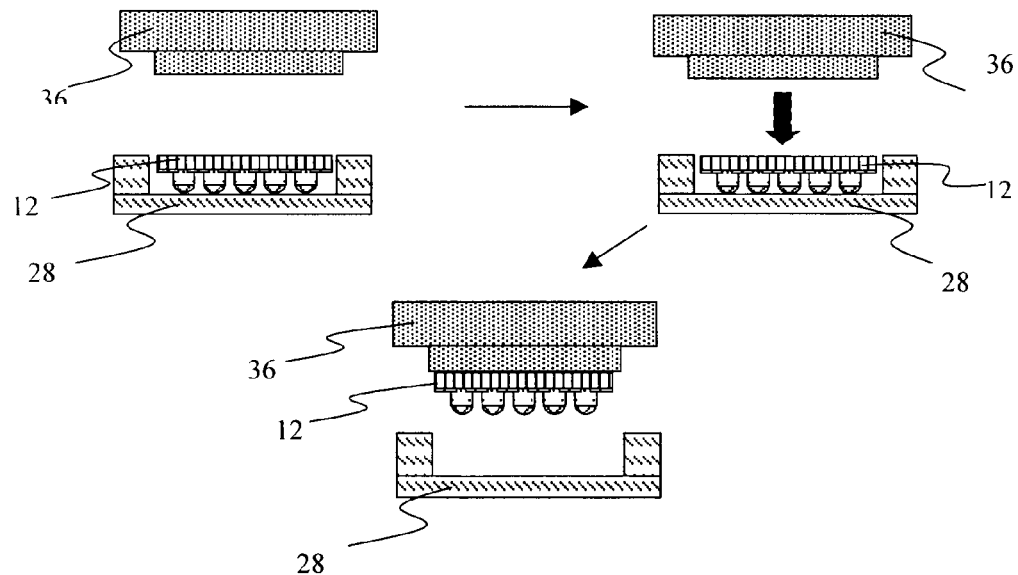
Figure 3G:
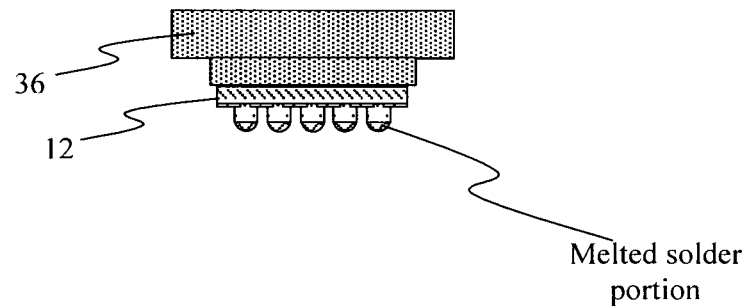
Figure 3H:
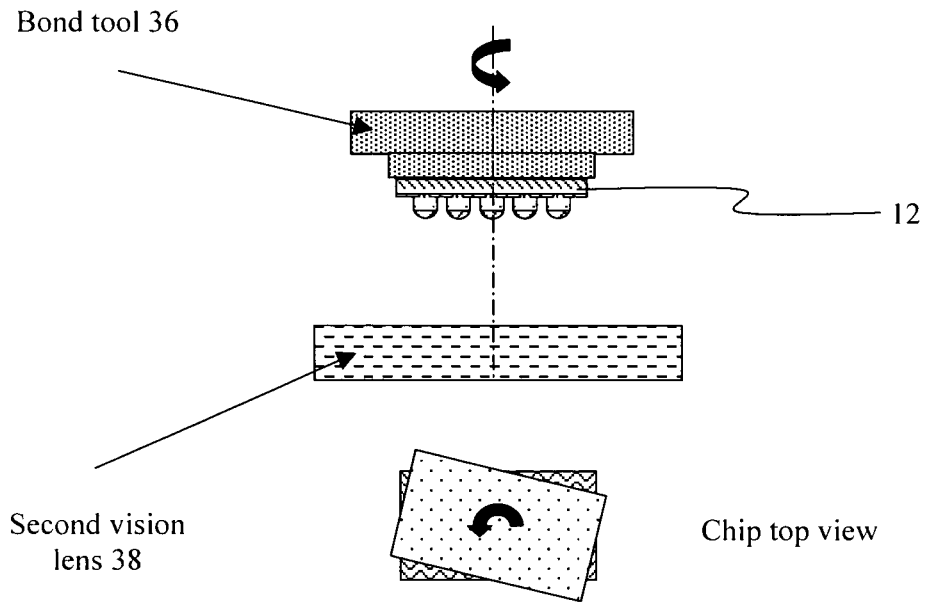

Preferably, the processing of the semiconductor chip 12 occurs via performance of an exemplary semiconductor chip processing process 200 that is provided by the present invention. A process flow diagram of the exemplary semiconductor chip processing process 200 is shown in FIG. 2.

In a step 210 of the exemplary semiconductor chip processing process 200, the semiconductor chip 12 is provided. Preferably, the semiconductor chip 12 is provided on a chip tray 14 or chip container containing multiple semiconductor chips 12. The semiconductor chip 12 preferably comprises bump structures 16 formed on a surface thereof. Such bump structures 16 preferably comprises a metal post 18 with a solder portion 20 formed at a free end of the metal post 18. Solder type used for the solder portion 20 includes, but is not limited to, metals and metal alloys such as silver and tin.

Alternatively, the bump structures 16 are similar to that of pillar humps as described in U.S. patent application Ser. No. 09/564,382, which is incorporated in the present description by reference. Alternatively, the semiconductor chip 12 comprises bumps or solder bumps formed on contact pads (collectively referred to as a pad array) formed on the surface of the semiconductor chip 12. The bump structures 16 are for mediating electrical communication of the semiconductor chip 12 with a substrate 22 or external circuitry. It will be understood by a person skilled in the art that alternative bump structures or electrical interconnects can also be used for performing the above-identified function of the bump structures 16.

In a step 220, the semiconductor chip 12 is transferred from the chip tray 14 to a chip pickup tool 24. To perform the step 220, a transfer tool 26 or gripper is used to pick up the semiconductor chip 12 from the chip tray 14. Preferably, the transfer tool 26 applies vacuum or suction for picking up the semiconductor chip 12, and for securing the semiconductor chip 12 to the transfer tool 26. The transfer tool 26 then flips the semiconductor chip 12 180-degrees vertically to position the semiconductor chip 12 at a pickup position for subsequent pickup by, or transfer to, the chip pickup tool 24. It will however be understood by a person skilled in the art that the transfer tool 26 may be alternatively displaced or rotated for displacing and positioning the semiconductor chip 12.

A thickness or height of the semiconductor chip 12 is then measured in a step 230. Preferably, the semiconductor chip 12 is transferred to a height calibration stage (not shown) for measuring the thickness or height of the semiconductor chip 12. The thickness or height of the semiconductor chip 12 is measured using an encoder (not shown), which is coupled to the chip pickup tool 24 for determining spatial position thereof. Preferably, calibration of the chip pickup tool 24 is performed by first reading back an encoder value at a point of contact with a first vision lens 30, which serves as a datum plane, followed by measuring additional encoder values when in contact with a reference gauge positioned on the first vision lens 30.

The semiconductor chip 12 is also orientated or aligned in the step 230. More specifically, the semiconductor chip 12 is orientated or aligned for corresponding to a slot (not shown) formed on a chip preheat stage 28. The positioning or orientating of the semiconductor chip 12 is facilitated by use of the first vision lens 30. The first vision lens 30 enables vision correction or vision alignment of the semiconductor chip 12 before being positioned on the chip preheat stage 28.

In a subsequent step 240, the semiconductor chip 12 is placed on the chip preheat stage 28. More specifically, the semiconductor chip 12 is preferably placed on the slot formed on the chip preheat stage 28. The semiconductor chip 12 is preferably held or secured to the chip preheat stage 28 by vacuum or suction. Alternatively, the semiconductor chip 12 is held or secured to the chip preheat stage 28 by mechanical means, for example by a gripper (not shown).

The semiconductor chip 12 placed on the chip preheat stage 28 is then preheated to a predetermined temperature in a step 250. The predetermined temperature is for example 200° C. The preheating of the semiconductor chip 12 is performed gradually by displacing the semiconductor chip 12 across a series of heaters 34 towards a bond tool location. More specifically, the semiconductor chip 12 is attached to a preheat buffer stage, also known as a turret, which is rotated for displacing the semiconductor chip 12 across the series of heaters 34. The heaters 34 are preferably convection heaters. Temperature of each heater 34 is preferably preset to provide incremental heating of the semiconductor chip 12 as it progresses from one to another of the heaters 34 along the series. Heating of the semiconductor chip 12 by the heaters may be effected by at least one of conduction, convection or radiation. Further preferably, the temperature of each heater 34 can be kept constant or can be varied as required.

The gradual preheating of the semiconductor chip 12, which can also be referred to as controlled preheating, of the semiconductor chip 12 reduces or eliminates thermal shock to the semiconductor chip 12. It will be understood by a person skilled in the art that preheating profile of the semiconductor chip 12 can be adjusted as required by altering any one or more of the temperatures of the radiation heaters 34. It will also be understood by a person skilled in the art that preheating profile of the semiconductor chip 12 can be adjusted as required by altering speed of displacement of the preheat stage and/or spacing between the semiconductor chip 12 and the radiation heaters 34. Control of the speed of the chip preheat stage 28 and control of the preheating of the semiconductor chip 12 can be either manually or software controlled.

As previously mentioned, the chip preheat stage 28 is displaced towards the bond tool location during the step 250. At the bond tool location, the semiconductor chip 12 is picked up by a bond tool 36 in a step 260. The semiconductor chip 12 is preferably held or secured to the bond tool 36 by vacuum or suction. Alternatively, the semiconductor chip 12 is held or secured to the bond tool 36 by mechanical means, for example by a gripper (not shown).

Preferably, the bond tool 36 is preheated and maintained at a predetermined elevated temperature prior to pick up of the semiconductor chip 12 in the step 260. The predetermined temperature is preferably sufficiently high enough to melt the solder portions 20 of the bump structures 16. The predetermined elevated temperature of the bond tool 36 is for example 260° C. It will however be understood by a person skilled in the art that the predetermined elevated temperature can be adjusted as required by methods well-known in the art. It will also be understood that the temperature of the bond tool 36 can be adjusted, more specifically increased or decreased, as required after the semiconductor chip 12 is picked up thereby. Control of temperature of the bond tool 36 can be either manually or software controlled.

The semiconductor chip 12 is then heated by the bond tool 36 to a chip processing temperature in a step 270. During the heating of the semiconductor chip 12 to the chip processing temperature, the temperature of the bond tool 36 is preferably maintained at the predetermined temperature, for example at 260° C. Preferably, the chip processing temperature is sufficiently high for heating the semiconductor chip 12 to thereby melting the solder portions 20 of the bumps structures 16 formed on the semiconductor chip 12. In addition, the chip processing temperature is preferably sufficiently high enough for maintaining the solder portions 20 of the bump structures 16 at the molten or liquid phase. The temperature of the bond tool 36 can be varied as required after the semiconductor chip 12 is received thereby. The variation or alteration of the temperature of the bond tool 36 can be effected using methods known to a person skilled in the art.

In a step 280, the bond tool 36, with the semiconductor chip 12 attached thereto, is positioned above a second vision lens 38. The second vision lens 38 facilitates x, y translational and θ angular alignment of the semiconductor chip 12 relative to the substrate 22. More specifically, the second vision lens 38 facilitates x, y translational and θ angular alignment of the bump structures 16 of the semiconductor chips 12 relative to bond pads 64 or bump structures (also known as interconnects) formed on the substrate 22.

Completion of the step 280 preferably completes the semiconductor chip 12 processing process 200. It will however be understood by a person skilled in the art that other semiconductor chip 12 processing steps and techniques may be additionally performed by the process 200.

The exemplary method 100 further comprises a step 120 of processing the substrate 22. The step 110 and the step 120 are preferably performed simultaneously. Alternatively, the step 110 and the step 120 are performed sequentially.

Figure 4:
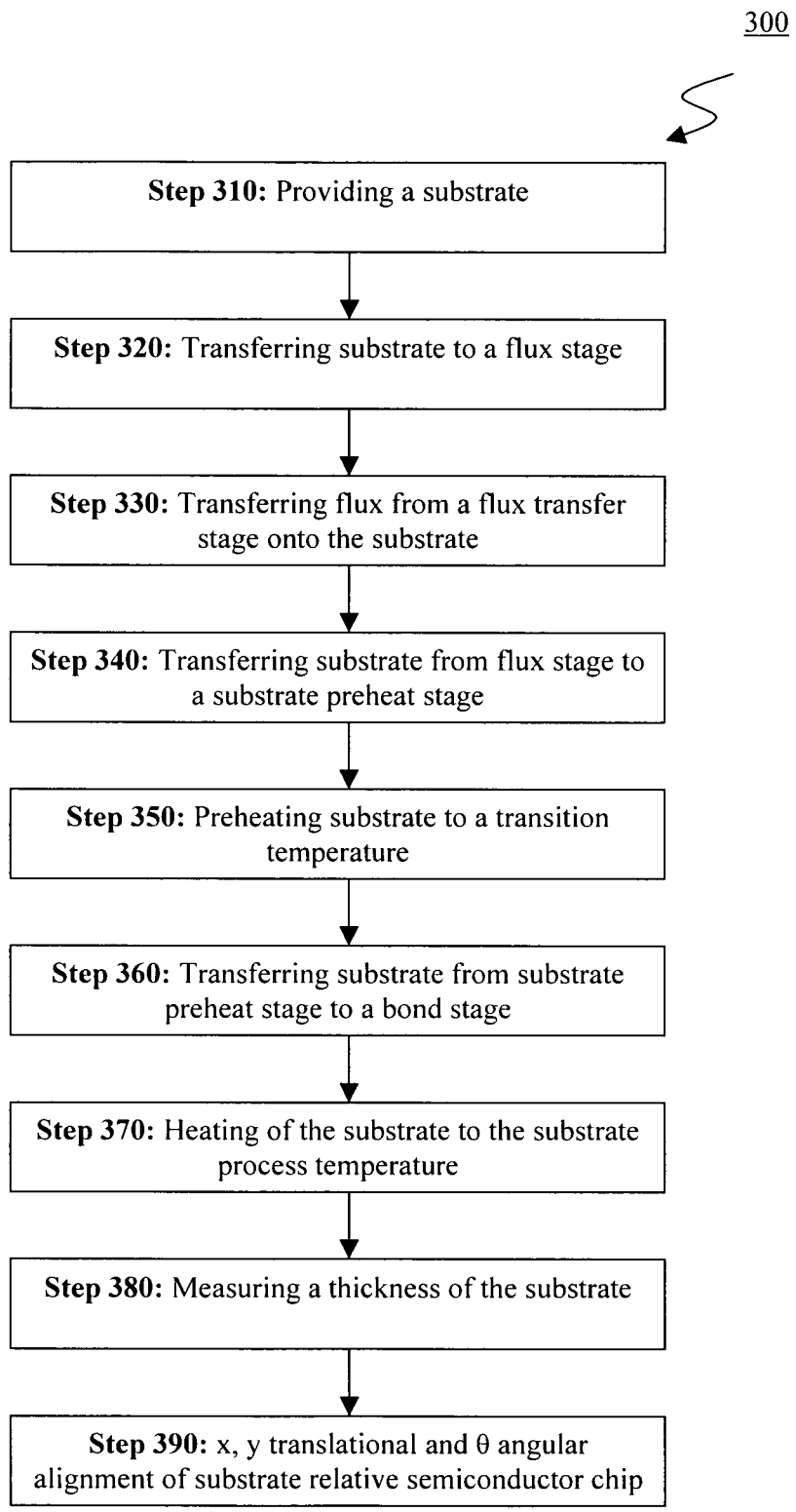
FIG. 4 is a partial process flow diagram of an exemplary substrate processing process performed in a step of the exemplary method of FIG. 1.

The substrate 22 may be a carrier, or a part of the carrier, for the semiconductor chip 12. Alternatively, the substrate 22 may be a leadframe. Preferably, the processing of the substrate 22 occurs via performance of an exemplary substrate processing process 300 provided by the present invention. A process flow diagram of the exemplary substrate processing process 300 is shown in FIG. 4.

In a step 310 of the exemplary substrate processing process 300, the substrate 22 is provided. Preferably, the substrate 22 is provided via a substrate magazine 50. The substrate 22 is then picked up by a substrate pickup tool 52 or device and transferred onto a flux stage 54 in a step 320. The substrate 22 is preferably held or secured to the flux stage 54 by vacuum or suction. Alternatively, the substrate 22 is held or secured to the flux stage 54 by mechanical means, for example by a gripper (not shown).

Figure 6:
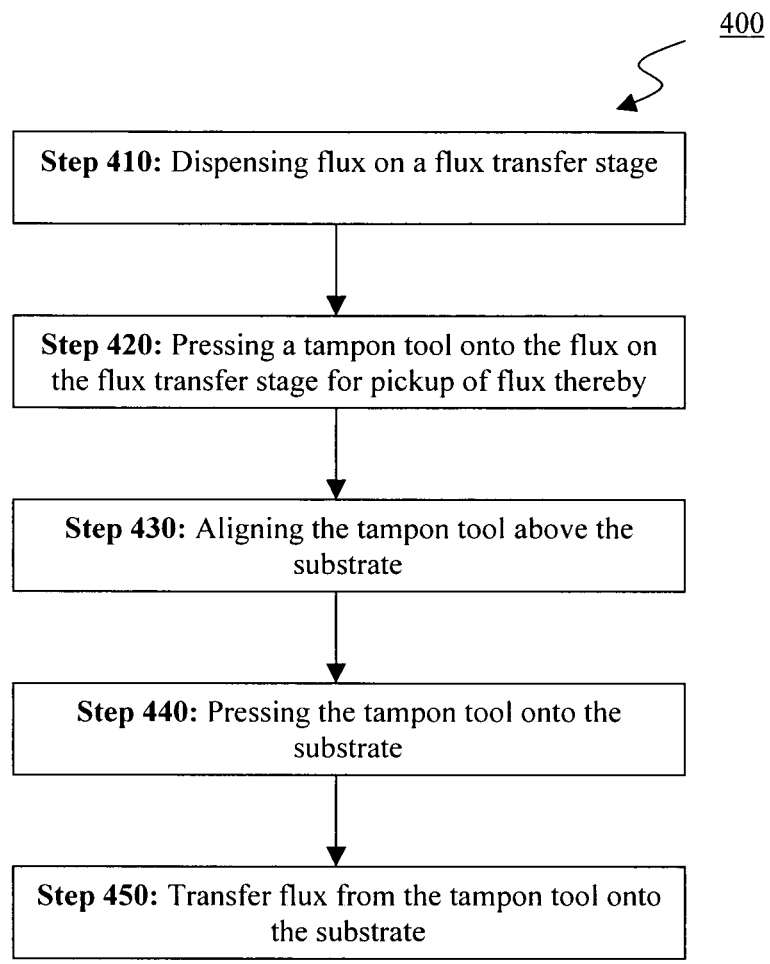
FIG. 6 is a partial process flow diagram of an exemplary flux transfer process performed by a step of the exemplary substrate processing process of FIG. 4.
Figure 7A:
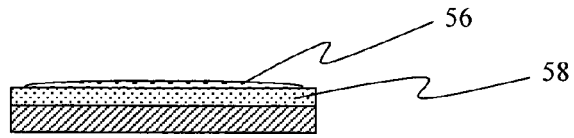
FIG. 7 illustrates the steps of the exemplary flux transfer process of FIG. 6.
Figure 7B:
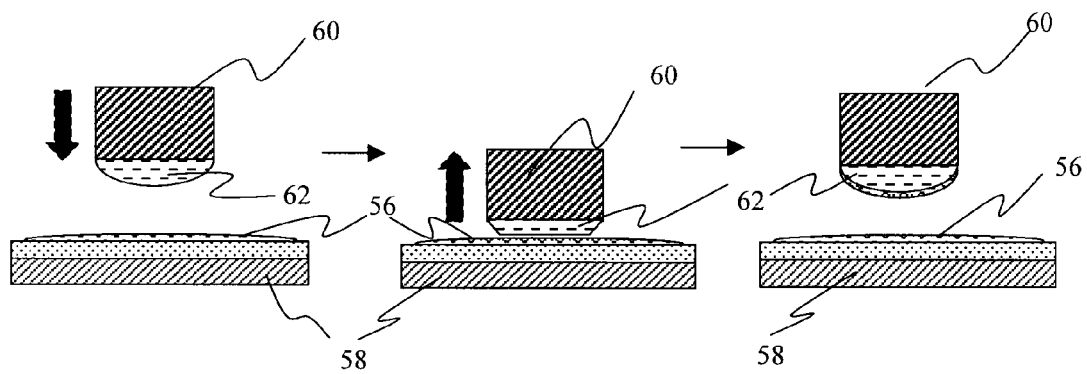
Figure 7C:
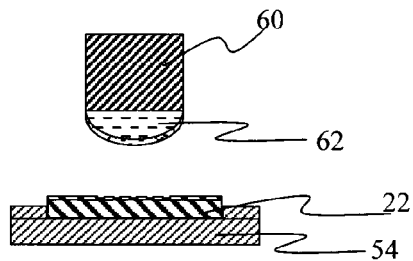
Figure 7D:
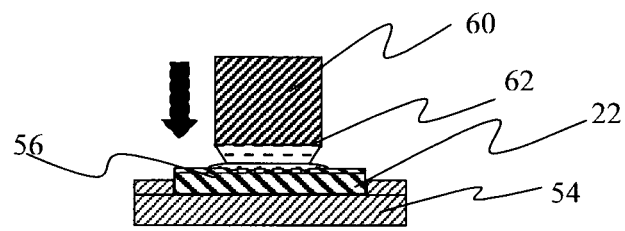
Figure 7E:
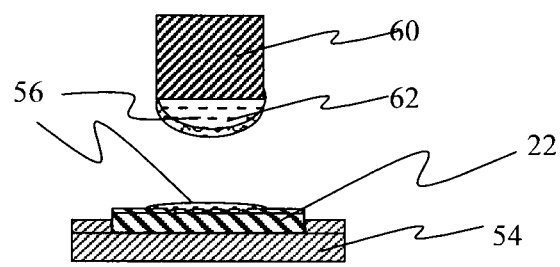

In a step 330, flux 56 (also known as fluxing agent) is transferred from a flux transfer stage 58 onto a surface of the substrate 22, more specifically onto the bond pads 64 of the substrate 22. The step 330 is preferably effected via an exemplary flux transfer process 400. A process flow diagram of the exemplary flux transfer process 400 is shown in FIG. 6.

In a step 410 of the exemplary flux transfer process 400, a predetermined quantity of flux 56 is dispensed on the flux transfer stage 58. The flux 56 or fluxing agent comprises of one or more materials or chemicals, which are known to a person skilled in the art. In a step 420, a tampon tool 60 is pressed onto the flux 56 on the flux transfer stage 58. Preferably, the tampon tool 60 is pressed onto the flux 56 with a predetermined pressure. A tip 62 of the tampon tool 60 is elastic and conforms to a pattern formed on the flux transfer stage 58. Preferably, the pattern formed on the flux transfer stage 58 corresponds to a pattern of holes or structures (not shown) formed on the flux transfer stage 58. Preferably, flux 56 is contained within the holes or structures formed on the flux transfer stage 58.

The pattern of holes or structures formed on the flux transfer stage 58 can be determined and altered as required using techniques known to a person skilled in the art. Preferably, the pattern of holes or structures on the flux transfer stage 58 corresponds with pattern of bond pads 64 formed on the substrate 22. A portion of the flux 56 adheres to or is picked up by the tip 62 of the tampon tool 60 when it is pressed onto the flux 56 on the flux transfer stage 58. Preferably, the pattern of holes or structures on the flux transfer stage 58 is determined for localizing the flux 56 transferred from the flux transfer stage 58 onto the bond pads 64 of the substrate 22. In other words, the pattern of holes on the flux transfer stage 58 preferably enhances accuracy of flux transfer onto the bond pads 64 of the substrate 22.

In a subsequent step 430, the tampon tool 60 is aligned or positioned above the substrate 22. Preferably, the tampon tool 60 is aligned or positioned in relation to the bond pads 64 formed on the surface of the substrate 22. In a step 440, the tampon tool 60 is then displaced for pressing onto the surface of the substrate 22 at a predetermined speed and pressure.

Pressing of the tampon tool 60 onto the surface of the substrate 22 preferably causes a transfer of flux 56 from the tip 62 of the tampon tool 60 onto the surface of the substrate 22 in a step 450.

Although only the exemplary flux transfer process 400 is described above, a person skilled in the art will understand that other methods and apparatuses for transfer flux 56 onto the surface of the substrate 22 may be utilized for performing the step 330.

For example, the transfer of flux 56 in the step 330 may be effected by screen printing or pin transfer techniques or methods. Use of pin transfer preferably enables auto-alignment and provides a more robust flux-transfer process for parallelism/flatness because of the soft-pin design. Alternatively, the flux 56 may be directly dispensed onto the surface of the substrate 22.

It will also be understood by a person skilled in the art that the flux 56 may comprise any one or more of fluxing materials or agents commonly known to a person skilled in the art.

The flux transfer process 400 can also be substituted with use of a no-flow underfill. The no-flow underfill can be transferred or dispensed onto the surface of the substrate 22 via methods known to a person skilled in the art. For example, the no-flow underfill may be directly dispensed onto the substrate 22 by use of a needle (not shown).

In a step 340, the substrate 22 comprising flux 56 on the surface thereof is transferred from the flux stage 54 onto a substrate preheat stage 66 (also known as a substrate preheat plate or holder) by a substrate pickup tool 72. Preferably, the substrate preheat stage 66 is preheated and maintained at a predetermined elevated temperature, for example 150° C. It will be understood by a person skilled in the art that the predetermined elevated temperature of the substrate preheat stage 66 can be predetermined and varied as required using techniques known in the art.

In a step 350, the substrate 22 on the substrate preheat stage 66 is heated to a transition temperature. The transition temperature of the substrate 22 can be selected, and is further variable, as required. Control of heating of the substrate 22 on the substrate preheat stage 66 can be either manually or software controlled.

The transfer of flux 54 occurring in the step 330 may alternatively be performed after the substrate 22 has been transferred onto the substrate preheat stage 66 and heated to the transition temperature.

In a step 360, the substrate 22 is transferred from the substrate preheat stage 66 to a bond stage 70 (also known as a bond plate or holder) using a substrate transfer tool 72. The substrate pickup tools 52 and 68 and the substrate transfer tool 72 may be the same tool. The substrate 22 is preferably held or secured onto the bond stage 70 by use of a vacuum or suction. Alternatively, the substrate is held or secured onto the bond stage 70 by alternative mechanical means or mechanism. Preferably, the vacuum or suction is applied at specific or predetermined positions on the substrate 22 held onto the bond stage 70. More preferably, the specific positions do not correspond to bond pad 64 locations on the substrate 22. This is to prevent deformation or warping of the substrate 22 when the substrate 22 is heated.

Preferably, the bond stage 70 is preheated and maintained at a predetermined elevated temperature. The predetermined elevated temperature of the bond stage 70 is for example 200° C. The predetermined elevated temperature of the bond stage 70 can be selected and varied as required using techniques known to a person skilled in the art. Temperature of the bond stage 70 can be either manually or software controlled.

The temperature of the bond stage 70 can be selected and varied depending on numerous factors. For example, the temperature of the bond stage 70 can be selected and varied depending on melting point of the solder portions 20 on the bump structures 16. Preferably, the temperature of the bond stage 70 is maintained at a temperature that is incapable of melting the solder portions 20 on the bump structures 16 of the semiconductor chip 12, and incapable of maintaining the solder portions 20 on the bump structures 16 of the semiconductor chip 12 at the molten or liquid phase. Further preferably, the temperature of the bond stage 70 is maintained at a temperature lower than the melting point of the solder portions 20 of the bump structures 16 of the semiconductor chip 12. The temperature of the bond stage 70 can further depend on activation temperature of the flux or on curing temperature of the no-flow underfill (when the no-flow underfill is used in place of the flux).

The temperature of the bond stage 70 can be varied as required after the bond stage 70 receives the substrate 22. The variation or alteration of the temperature of the bond stage 70 can be effected using methods known to a person skilled in the art. The bond stage 70 is designed for reducing or preventing heat dissipation from the substrate 22 to the bond stage 70. Preferably, the bond stage 70 is designed such that copper traces, which may be present on the substrate 22, do not come into contact with the bond stage 70 so as to minimize heat dissipation or heat losses. Alternatively, the bond stage 70 is designed such areas thereof in contact with the copper traces are constructed from heat insulating materials including, but not limited to, ceramic.

The substrate 22 positioned on the bond stage 70 is then further heated by bond stage 70 to a substrate processing temperature in a step 370. The substrate processing temperature of the substrate 22 is preferably lower than the chip processing temperature of the semiconductor chip 12. Alternatively, the substrate processing temperature of the substrate 22 is equal or similar to the chip processing temperature of the semiconductor chip 12. Preferably, the heating of the substrate 22 to the transition temperature in the step 350 reduces time required for the further heating of the substrate 22 to the substrate processing temperature in the step 370. The temperature of the bond stage 70 is preferably maintained at the predetermined elevated temperature, for example 200° C.

In a step 380, a thickness or height of the substrate 22 is measured and recorded by a substrate thickness measurement tool 74 or apparatus. The substrate thickness measurement tool 74 preferably determines the thickness or height of the substrate 22 with reference to a datum defined by the bond stage 70. Further preferably, the substrate thickness measurement tool 74 measures thickness of the substrate 22 excluding the bond pads 64 and flux 56. Preferably, the substrate thickness measurement tool 74 further measures at least one of thickness of flux 56 on the substrate 22 and height of bond pads 64, also known as contact pads, formed on the substrate 22.

The bond stage 70 is then positioned below the second vision lens 38 in a step 390. Preferably, the second vision lens 38 facilitates at least one of x, y translational and θ angular alignment of the substrate 22 relative to the semiconductor chip 12. More specifically, the second vision lens 38 facilitates x, y translational and θ angular alignment of the bond pads 64 formed on the substrate 22 relative to the bump structures 16 formed on the semiconductor chip 12. The second vision lens can alternatively be referred to as a look-up/look-down camera for facilitating at least one of x, y translational and θ angular alignment of the substrate 22 relative to the semiconductor chip 12. It will however be appreciated by a person skilled in the art that the x, y translational and θ angular alignment of the bond pads 64 formed on the substrate 22 relative to the bump structures 16 formed on the semiconductor chip 12 can be effected by a third vision lens (not shown) or other alignment means known in the art.

Figure 8:
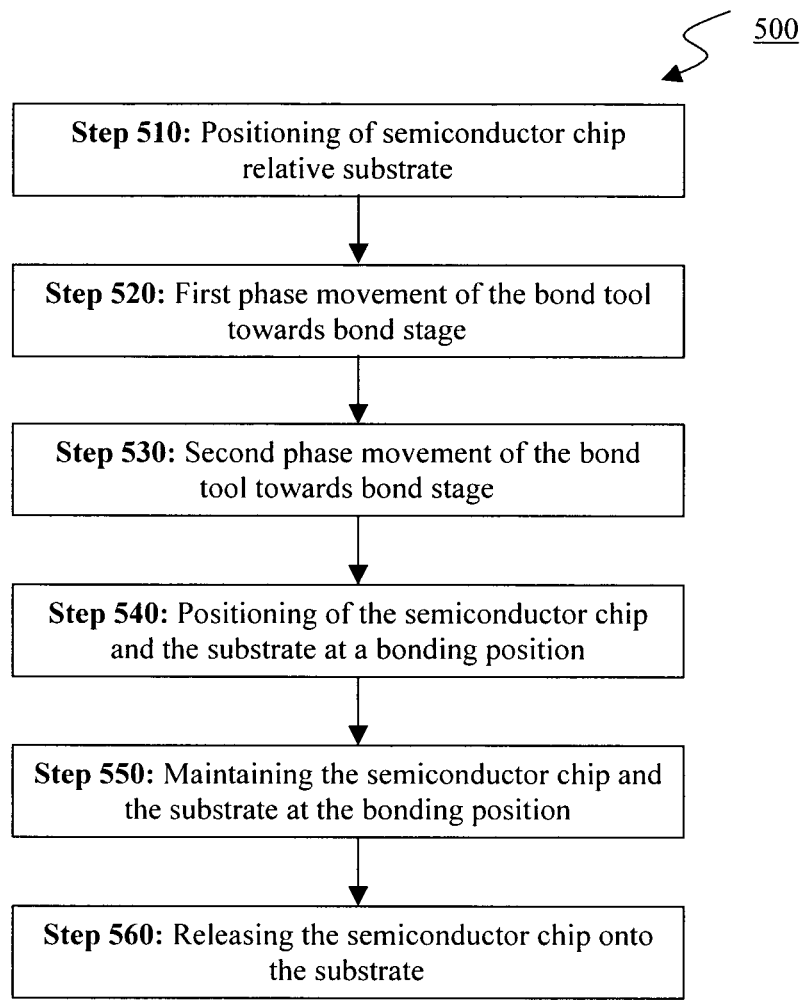
FIG. 8 is a partial process flow diagram of an exemplary bonding process performed in a step of the exemplary method of FIG. 1.
Figure 9A:
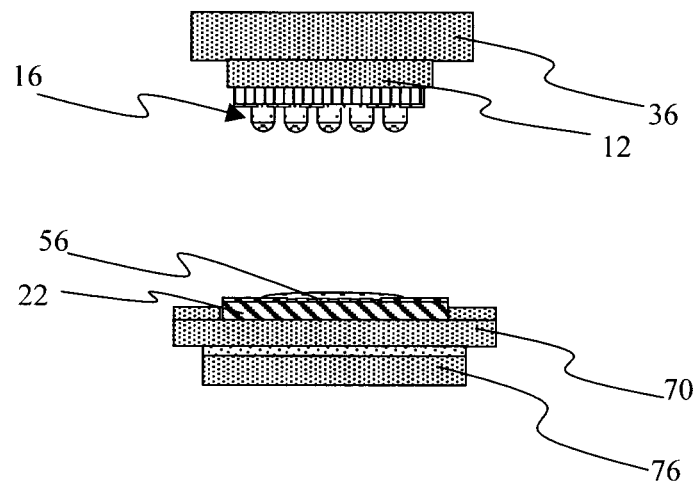
FIG. 9a to FIG. 9d illustrates the steps of the exemplary bonding process of FIG. 6.
Figure 9B:
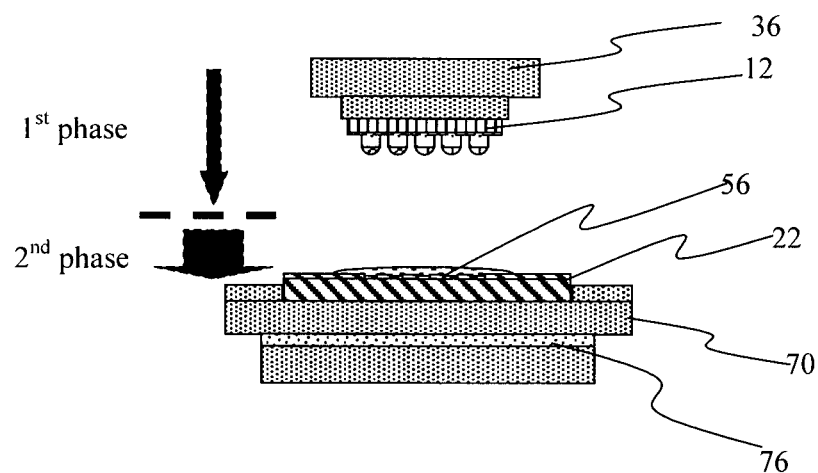
Figure 9C:
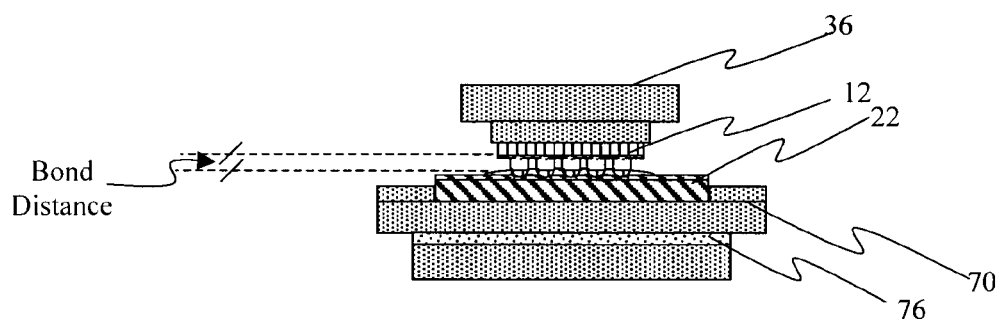
Figure 9D:
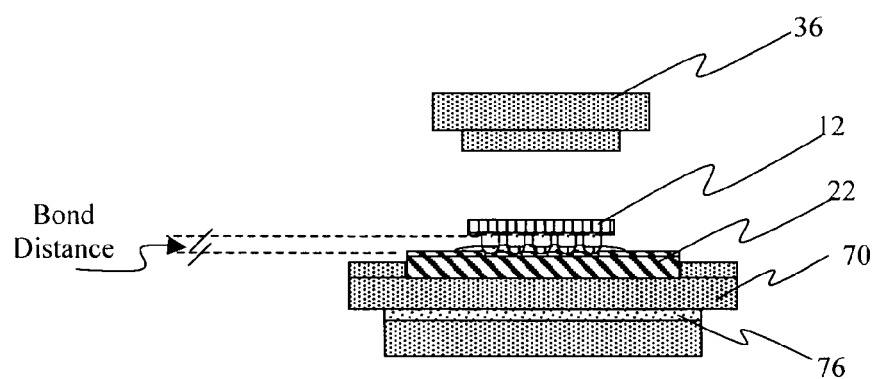

The processing of the semiconductor chip 12 in the step 110 and the processing of the substrate 22 in the step 120 prepares the semiconductor chip 12 and the substrate 22 for bonding therebetween in a step 130. Preferably, the bonding between the semiconductor chip 12 and the substrate 22 in the step 130 occurs via an exemplary bonding process 500 provided by the present invention. A process flow diagram of the exemplary bonding process 500 is shown in FIG. 8.

As previously described the second vision lens 38 facilitates at least one of x, y linear and θ angular alignment of the semiconductor chip 12 relative to the substrate bond pad locations. More specifically, the second vision lens 38 facilitates at least one of x, y linear and θ angular alignment of the bump structures 16 formed on the semiconductor chip 12 with the bond pads 64 formed on the substrate 22.

In a step 510, the bond tool 36 positions and aligns the semiconductor chip 12 above the substrate 22 positioned on the bond stage 70. Preferably, the positioning of the semiconductor chip 12 above the substrate 22 in the step 510 aligns the bump structures 16 of the semiconductor chip 12 with the bond pads 64 of the substrate 22.

Preferably, the second vision lens 38 facilitates a definition of a first coordinate system of the semiconductor chip 12 and a number of reference axes intersecting and configuratively corresponding with the bump structures 16 of the semiconductor chip 12. In addition, the second vision lens 38 further facilitates a definition of a second coordinate system of the substrate 22 and a number of reference vertices coinciding and configuratively corresponding with the bond pads 64 of the substrate 22. Preferably, the second vision lens 38 is coupled or electrically communicable with a programmable controller (not shown).

The programmable controller is preferably programmed for defining the first coordinate system and the second coordinate system. In addition, the programmable controller enables alignment of the first coordinate system with the second coordinate system for substantially coinciding each of the number of reference axes with a corresponding one of the number of reference vertices to thereby enable or aid a accurate spatial alignment of the bump structures 16 of the semiconductor chip 12 with the bond pads 64 of the substrate 22.

The semiconductor chip 12 is preferably at the chip processing temperature and the substrate 22 is preferably at the substrate processing temperature. The maintenance of the semiconductor chip 12 at the chip processing temperature preferably maintains the solder portions 20 on the bump structures 16 thereof at the molten or liquid phase.

In a step 520, a first phase movement or displacement of the bond tool 36 towards the bond stage 70 occurs. Movement of the bond tool 36 towards the bond stage 70 displaces the semiconductor chip 12 attached to the bond tool 36 towards the substrate 22 on the bond stage 70. The first phase movement of the bond tool 36 in the step 520 is preferably performed at a fast speed, which can be predetermined and is further alterable as required.

In a step 530, a second phase movement or displacement of the bond tool 36 further towards the bond stage 70 occurs. Movement of the bond tool 36 towards the bond stage 70 displaces the semiconductor chip 12 attached to the bond tool 36 towards the substrate 22 on the bond stage 70. The second phase movement of the bond tool 36 is preferably at a slower speed as compared to the first phase movement of the bond tool 36. The slower speed of the bond tool 36 during the second phase movement minimizes risk of molten or liquid solder wicking or splashing to adjacent bond pads 64 and causing unwanted electrical shorting.

The steps 520 and 530 facilitate a positioning of the semiconductor chip 12 and the substrate 22 at a bonding position in a step 540. It will be appreciated by a person skilled in the art having the disclosure provided by the present description that additional phases of movement or displacement of the bond tool 36 relative to the bond stage 70 may be effected.

Movement of the bond tool 36 during such additional phases of movement may be of faster or slower speeds as compared to the speeds of either the first page movement in the step 520 or the second phase movement in the step 530. In addition, movement of the bond tool 36 during such additional phases of movement may be towards or away from the bond stage 70.

At the bonding position, the molten or liquid solder portions 20 of the semiconductor chip 12 contacts corresponding bond pads 64 of the substrate 22. The separation or spacing between the semiconductor chip 12 and the substrate 22 at the bonding position can be referred to as a bond distance (also known as a separation distance).

Figure 10:
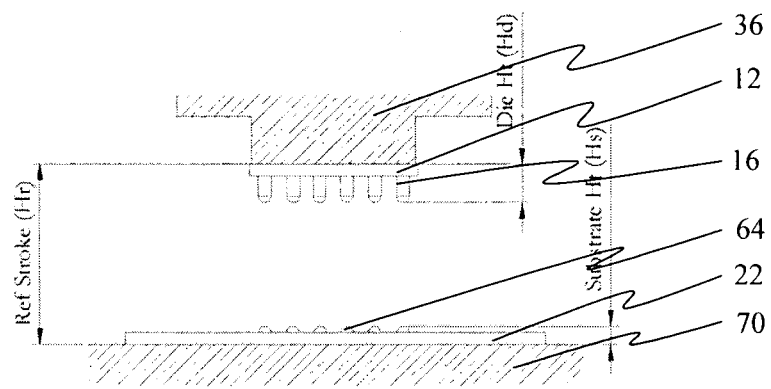
FIG. 10 shows a partial formula for managing displacement height during the exemplary bonding process of FIG. 6.
Figure 11:
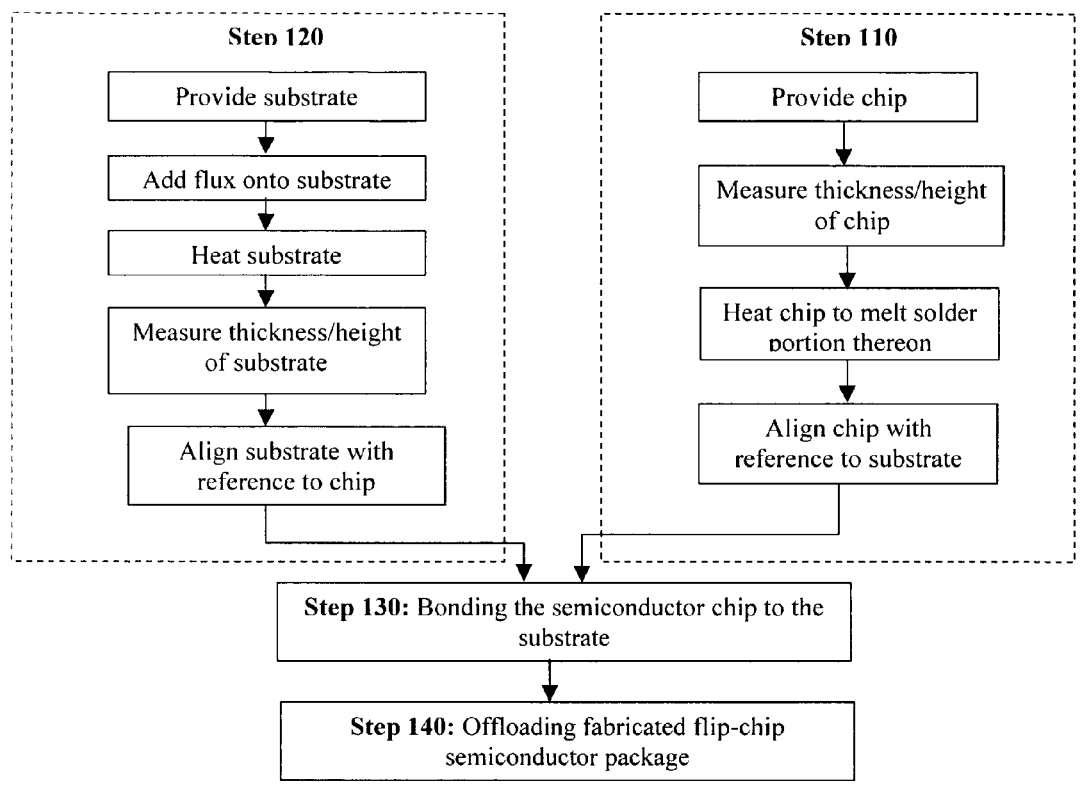
FIG. 11 shows a partial process flow diagram of key steps of the exemplary method of FIG. 1.

Preferably, the bond distance is determined and is further variable as required based on the thickness of the substrate 22 as measured in the step 380. Further preferably, the bond distance is further determined or varied based on height of the semiconductor chip 12 measured in the step 230. The height of the semiconductor chip 12 is preferably taken to comprise height of the bump structures 16 formed thereon. An exemplary calculation formula for measuring and managing bond distance (and distances between the semiconductor chip 12 and the substrate 22 during the steps 520 to 540) is shown in FIG. 10. It will be appreciated, that the magnitude of displacement of the bond tool 36 towards the bond stage 70 during the first phase and second phase movement of the steps 520 and 530 respectively is carefully determined and selected for positioning the bump structures 16 of the semiconductor chip 12 onto corresponding bond pads 64 of the substrate 22.

Height or thickness of semiconductor chip or die (Hd) is measured during the step 230. Height or thickness of the substrate (Hs) is measured during the step 380. Preferably, the magnitude of displacement of the semiconductor chip 12 during the steps 520 and 530 is known as actual stroke. The actual stroke is calculated using the exemplary calculation formula as shown in FIG. 10. Preferably, the actual stroke is calculated by subtracting Hd and Hs from a reference height (Hf), which is a height between the bond tool 36 and bond stage 70 or between the semiconductor chip 12 and the substrate 22, and adding a predetermined compression offset value (i.e. Actual Stroke=Hf−Hd−Hs+compression offset value). The compression offset is added for overcoming any co-planarity variances from the semiconductor chip 12 and the substrate 22. Management of the bond distance (and distances between the semiconductor chip 12 and the substrate 22 during the steps 520 to 540) enhances accuracy and stability of bonds formed between the semiconductor chip 12 and the substrate 22.

Figure 12:
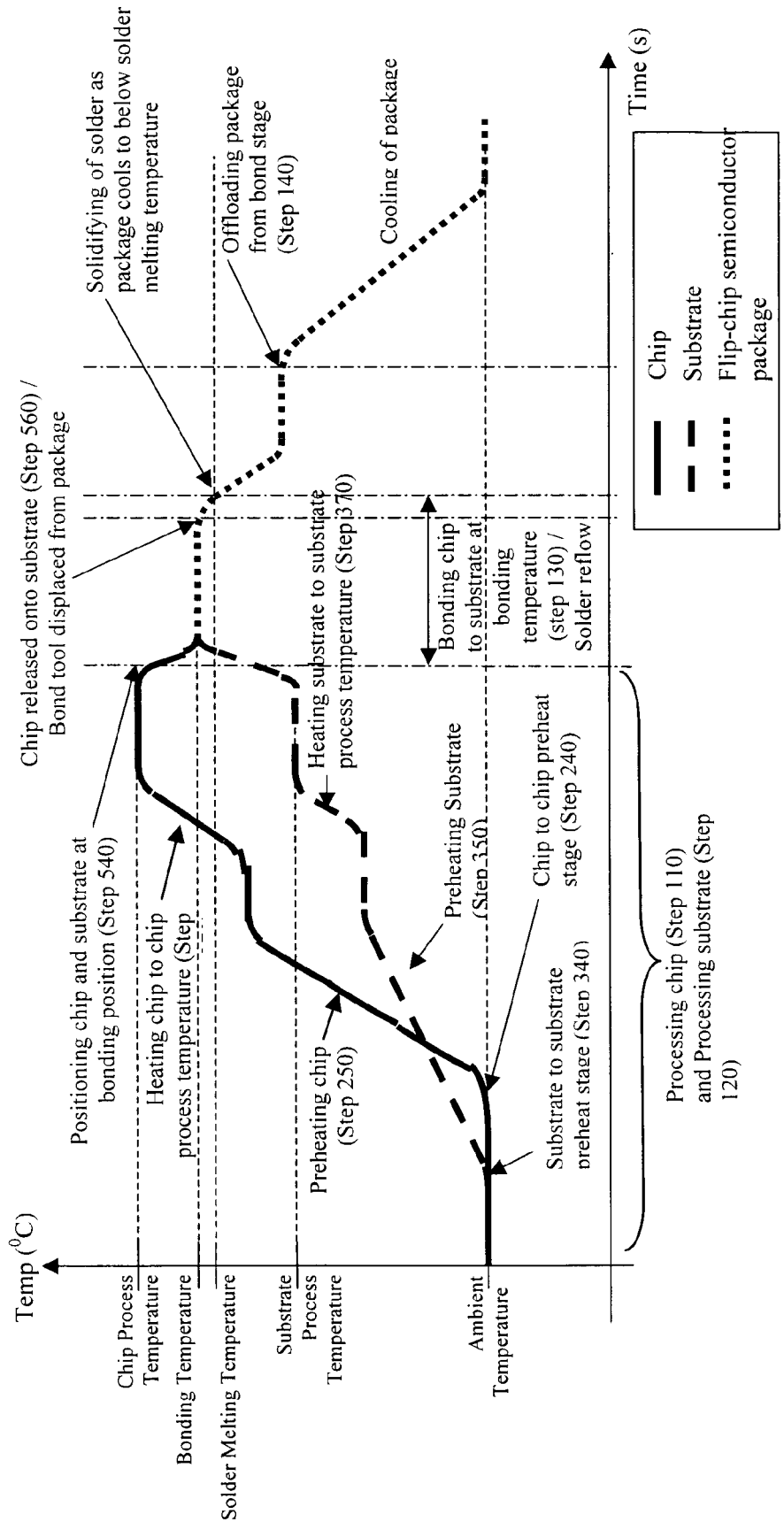
FIG. 12 shows an exemplary temperature profile during the exemplary method of FIG. 1.

The bond tool 36 and the bond stage 70 respectively maintain the semiconductor chip 12 and the substrate 22 at the chip processing temperature and the substrate processing temperature respectively. Temperature of each of the bond toot 36 and the bond stage 70 is preferably carefully controlled and managed during the method 100. An exemplary temperature profile during the method 100 is shown in FIG. 12.

Preferably, the temperature of each of the bond tool 36 and the bond stage 70 can be carefully and accurately measured, monitored and regulated as required during the method 100. Preferably, the control and maintenance of the temperatures of each of the bond tool 36 and the bond stage 70 correspondingly enables thermal management of the semiconductor chip 12 and the substrate 22 respectively during the bonding process 500. In addition, the control and maintenance of the temperatures of each of the bond tool 36 and the bond stage 70 helps control and maintain temperature at junctions between the solder portions 20 of the bump structures 16 and the bond pads 64.

As previously described, it is important to set and maintain the temperature of the bond tool 36 for heating the semiconductor chip 12 to a sufficiently high temperature for melting the solder portion on the bump structures 16 thereof, and to maintain the solder portions 20 of the bump structures 16 of the semiconductor chip 12 at the molten or liquid phase.

Preferably, the bond stage 70 is designed and structured for preventing fast heat drainage (i.e. for retaining heat therewithin). Preferably, the bond stage 70 comprises an insulating layer 76 coupled thereto or incorporated therewithin. The insulating layer 76 helps slow heat drainage or heat transfer through the bond stage 70. This is to say, the insulating layer 76 prolongs retention of heat within the bond stage 70. Preferably, heat retained within the bond stage 70 maintains the temperature at the junctions between the solder portions 20 of the bump structures 16 and the bond pads 64 of the substrate 22 at a sufficiently high temperature for maintaining the solder portions 20 at the molten or liquid state. The insulating layer 76 preferably comprises air pockets or air bubbles therewithin. Alternatively, the insulating layer 76 is made of a material having a low thermal conductivity.

Preferably, a water-cooled setup or mechanism 610 is coupled to the bond stage 70 for reducing or preventing heat dissipation from the bond stage 70 to the other components. The water-cooled setup or mechanism 610 preferably comprises at least one plate positioned adjacent a surface of the bond stage 70, and at least one pipe connector 612 for circulating fluid through the at least one plate to thereby reduce heat dissipation from (or insulated) the bond stage 70.

In a step 550, the semiconductor chip 12 and the substrate 22 are maintained at the bonding position for a predetermined time period to thereby allow or facilitate sufficient bonding or interconnect formation between the semiconductor chip 12 and the substrate 22. More specifically, the semiconductor chip 12 and the substrate 22 are maintained at the bonding position for a predetermined time period to facilitate sufficient bonding between the solder portions 20 on the bump structures 16 of the semiconductor chip 12 and the bond pads 64 of the substrate 22.

Preferably, the semiconductor chip 12 and the substrate 22 are brought to a bonding temperature during the step 550. More specifically, junctions between the bump structures 16 of the semiconductor chip 12 and the bond pads 64 of the substrate 22 are brought to the bonding temperature during the step 550. The bonding temperature during the step 550 is preferably between the chip process temperature and the substrate process temperature. More specifically, the bonding temperature is lower than the chip process temperature and higher then the substrate process temperature.

The bond tool 36 then releases the semiconductor chip 12 onto the substrate 22 in a step 560. Preferably an air purge by the bond tool 36 occurs before the release of the semiconductor chip 12 onto the substrate 22 in the step 560. The air purge facilitates removal or detachment of the semiconductor chip 12 from the bond tool 36. Preferably, pressure of the air purge is controlled for preventing application of unwanted pressure onto the molten solder present between the semiconductor chip 12 and the substrate 22, more specifically between the bump structures 16 of the semiconductor chip 12 and the bond pads 64 of the substrate 22. The solder between the bump structures 16 on the semiconductor chip 12 and the bond pads 64 of the substrate 22 then solidifies for completing the bonding between the semiconductor chip 12 and the substrate 22.

Figure 13:
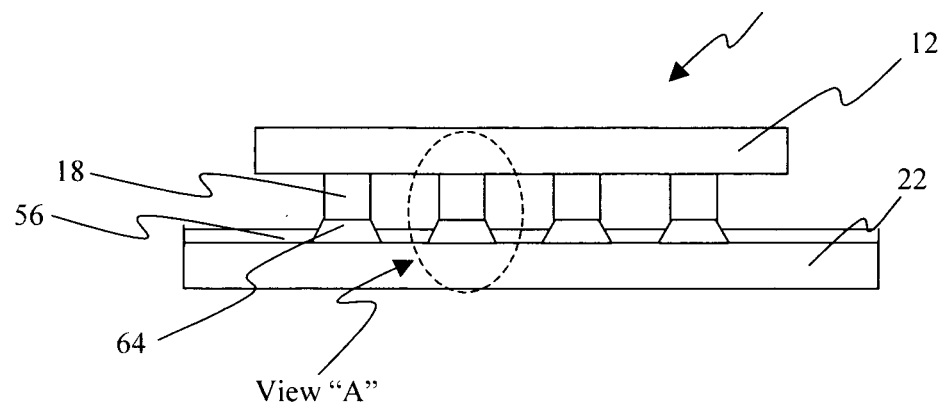
FIG. 13 shows a partial cross-sectional view of the flip-chip semiconductor package fabricated by the exemplary method of FIG. 1.
Figure 14:
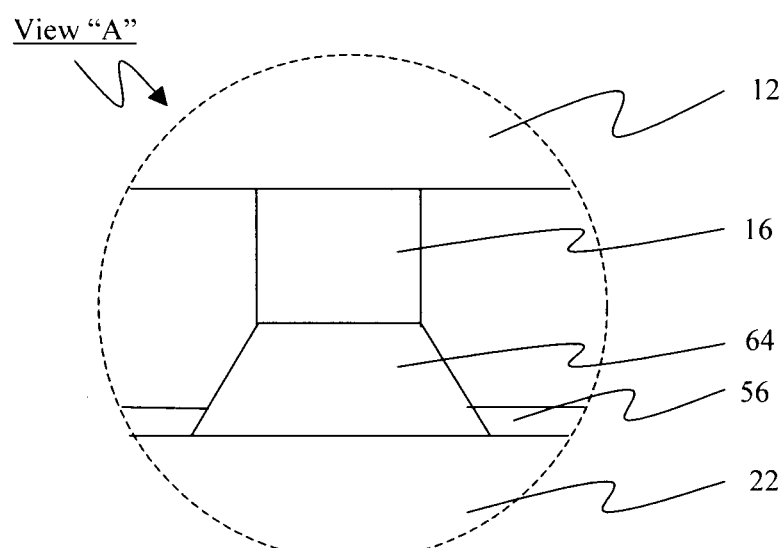
FIG. 14 shows an exploded partial cross-sectional view "A" of the flip-chip semiconductor package of FIG. 13.

Performance of the steps 110 to 130 of the exemplary method 100 facilitates bonding of the semiconductor chip 12 to the substrate 22 for forming the flip-chip semiconductor package 10. A partial cross-sectional view of the flip-chip semiconductor package 10 is shown in FIG. 13 and FIG. 14. This is also to say that the steps 110 to 130 of the exemplary method 100 represent steps in a method for packaging the semiconductor chip 12.

In a step 140, the formed flip-chip semiconductor package 10, more specifically assembly of semiconductor chip 12 bonded with the substrate 22, is transferred or offloaded from the heated bond stage 70 to an offload stage (not shown). The flip-chip semiconductor package 10 then cools to room temperature on the offload stage. Alternatively, the flip-chip semiconductor package 10 cools to a different temperature (which is lower than the temperature of the bond stage) as required while on the offload stage.

Preferably, the temperature of the offload stage may be controlled and varied as required for facilitating controlled cooling of the flip-chip semiconductor package 10. The cooling of the flip-chip semiconductor package 10 may be effected naturally. Alternatively, the cooling of the flip-chip semiconductor package 10 may be effected by forced convection cooling. For forced convection cooling, fluids, for example inert gases such as nitrogen, is pumped towards the flip-chip semiconductor package 10 for effecting the cooling thereof.

Alternatively, the flip-chip semiconductor package 10 may be transferred to one or more intermediate stage (not shown) before being transferred onto the offload stage. Preferably, the temperature of the intermediate stage is between the temperature of the bond stage 70 and the temperature of the offload stage. Further preferably, maintenance or control of the temperature of the intermediate stage facilitates controlled cooling of the flip-chip semiconductor package 10. Control of the cooling of the flip-chip semiconductor package 10 can be either manually or software controlled.

Although only the exemplary method 100 for fabricating a flip-chip semiconductor package provided by an embodiment is described above, a person skilled in the art will understand that various modifications to the steps, or the sequence thereof, of any one or more of the processes 200, 300, 400 and 500 may be made without departing from the scope of the present invention. A person skilled in the art will also appreciate that the steps of the method 100 represent steps in a general method for packaging a semiconductor component or device, for example semiconductor chips and transistors.

In the exemplary method 100, the solder portions 20 of the bump structures 16 formed on the semiconductor chip 12 is maintained in the molten or liquid phase by thermal management of the bond tool 36. However, it will be appreciated by a person skilled in the art having the disclosure provided by the present description that the solder portions 20 of the bump structures 16 formed on the semiconductor chip 12 may alternatively be maintained in the solid phase prior to, and during the steps of 510 to 530 of the bonding process. In this case, the solder portions 20 of the bump structures 16 formed on the semiconductor chip 12 are melted during positioning of the semiconductor chip 12 at the bonding position in the step 540.

It will also be appreciated by a person skilled in the art with the disclosure provided by the present description that the exemplary method 100 for fabricating flip-chip semiconductor packages 10 enables accurate positioning of the bump structures 16 of the semiconductor chip 12 relative to the bond pads 64 of the substrate 22 during heating for reflow of the solder therebetween to thereby aid formation of accurate and reliable interconnects between the semiconductor chip 12 and the substrate 22.

Figure 15A:
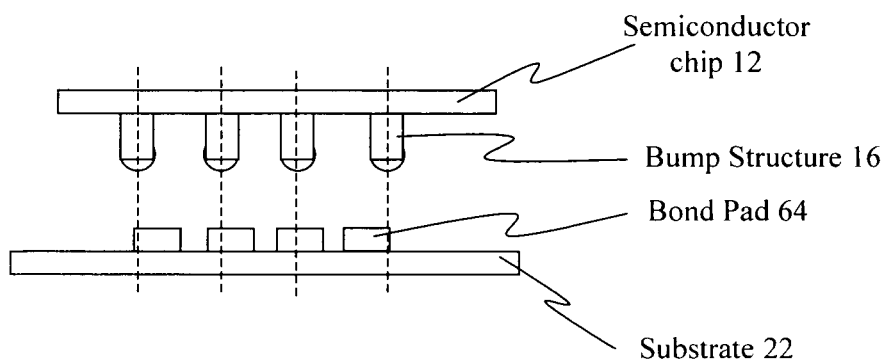
FIGS. 15a to 15b provides a diagrammatic overview of pitch compensation between solder bumps or interconnects formed on the substrate of the flip-chip semiconductor package that is fabricated by the exemplary method of FIG. 1.
Figure 15B:
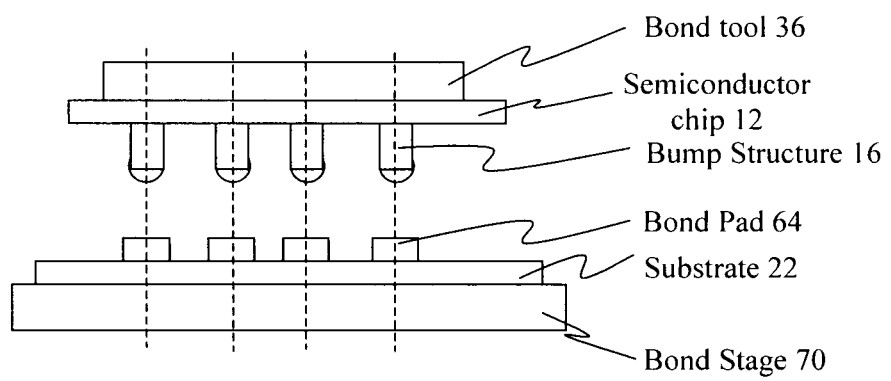

Generally, semiconductor chips (and other semiconductor devices) have different coefficients of thermal expansion (CTE) as compared to substrates or carriers. Heating of materials with different CTEs results in differential thermal expansion thereof. Accordingly, the heating of the semiconductor chip 12 and the substrate 22 typically results in differential thermal expansion between the semiconductor chip 12 and the substrate 22. In a preferred embodiment of the present invention, pitch compensation occurs for the bond pads 64 of the substrate 22. The pitch compensation between the bond pads 64 of the substrate 22 is preferably calculated and determined for the offsetting differential thermal expansion between the semiconductor chip 12 and the substrate 22 due to their differential coefficients of thermal expansion (CTE) to thereby ensure accurate bonding, or interconnect formation, between the bump structures 16 of the semiconductor chip 12 and their corresponding bond pads 64 of the substrate 22. Further preferably, the pitch compensation between the bond pads 64 of the substrate 22 is performed for preventing electrical shorting between the interconnects formed. A partial diagrammatic overview of the pitch compensation of the bond pads 64 of the substrate 22 is shown in FIGS. 15*a* and 15*b*.

Alternatively, pitch compensation is performed between the bump structures 16 of the semiconductor chip 12. The pitch compensation between the bump structures 16 of the semiconductor chip 12 is preferably calculated and determined for offsetting differential thermal expansion between the semiconductor chip 12 and the substrate 22 due to their differential coefficients of thermal expansion (CTE).

Further alternatively, pitch compensation is performed for both the bump structures 16 of the semiconductor chip 12 as well as for the bond pads 64 of the substrate 22 for offsetting the differential thermal expansion between the semiconductor chip 12 and the substrate 22 due to their differential coefficients of thermal expansion (CTE).

The above described pitch compensation process or technique preferably ensures precise or near-precise bonding between the semiconductor chip 12 and the substrate 22, more specifically between the bump structures 16 of the semiconductor chip 12 and the bond pads 64 of the substrate 22, by the exemplary method 100. In addition, the above described pitch compensation process or technique preferably minimizes alignment or bonding offset between the semiconductor chip 12 and the substrate 22. A person skilled in the art provided with the disclosure of the present description will understand that the modifications to the pitch compensation process may also be done without departing from the scope of the present invention.

Figure 16:
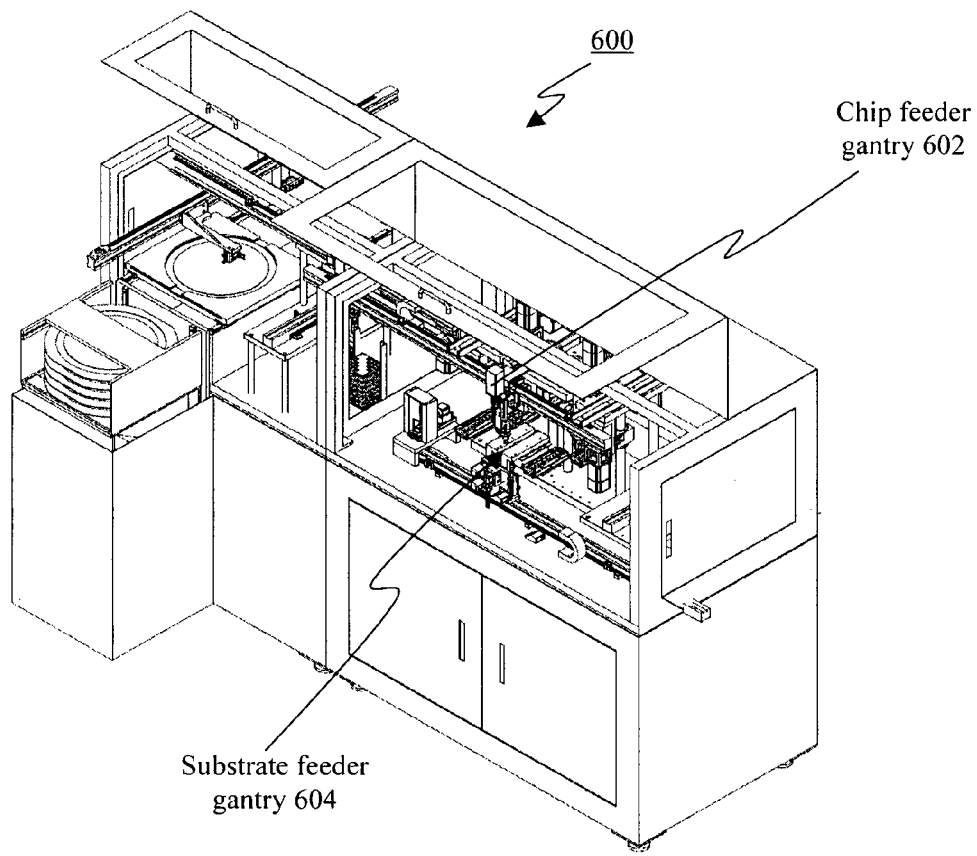
FIG. 16 shows a partial system diagram of an exemplary system for fabricating a flip-chip semiconductor package according to an embodiment of the present invention.

An exemplary system 600 or apparatus for packaging a semiconductor device or component, more specifically an exemplary system for fabricating the flip-chip semiconductor package 10 is also provided by the present invention. The exemplary system 600 is shown in FIG. 16.

The exemplary system 600 comprises means for performing the method 100 as described above. More specifically, the exemplary system 600 comprises means for performing any one or more of the steps 100 to 140 of the method 100, steps 210 to 280 of the process 200, steps 310 to 390 of the process 300, steps 410 to 450 of the process 400 and steps 510 to 560 of the process 500. The means referred to above are for example components, tools, elements or apparatuses, which are shaped and configured using techniques known to a person skilled in the art.

For purposes of clarity and brevity, several key components of the system 600 will be further described below. It will however be appreciated by a person skilled in the art with the disclosure provided by the present description that this does not limit the scope of the system 600 covered by present invention.

As previously mentioned, the system 600 comprises means for performing the steps 210 to 280 of the process 200. Preferably, the system 600 comprises a semiconductor chip feeder gantry 602 used for facilitating the step 210 of providing the semiconductor chip 12.

The system 600 further comprises means for measuring thickness or height of the semiconductor chips 12. Preferably, measurement of the thickness or height of the semiconductor chips 12 is effected or facilitated by the chip pickup tool 24 and the encoder information as described above. It will however be appreciated by a person skilled in the art that alternative mechanisms may be used for measuring the thickness or height of the semiconductor chips 12.

The system 600 also comprises heating means, elements or devices for preheating the semiconductor chip 12 during the step 240 and for further heating the semiconductor chip 12 to the chip process temperature in the step 270. It is important to note that that the chip process temperature is preferably sufficient high enough to enable melting of solder portions 20 on the bump structures 16. Control and maintenance of the of at least one of the preheating and further heating of the semiconductor ship 12 is either software controlled or manually controlled using techniques known to a person skilled in the art.

In addition, the system 600 further comprises means for processing the substrate 22, or performing the steps 310 to 390, in the process 300. The system 600 preferably comprises a substrate feeder gantry 604 for providing the substrate 22 in the step 310.

The system 600 further comprises means for transferring flux 56 onto the substrate 22 in the step 320. As previously described, flux transfer may be performed by use of the tampon tool 60 for transferring flux 56 deposited on the flux transfer stage 58 onto the substrate 22. Alternatively, the system 600 can comprise other means or mechanisms for transferring flux 56 onto the substrate 22. Further alternatively, the system 600 comprises other means or mechanisms for transferring the no-flow underfill in place of flux onto the substrate 22.

Figure 5A:
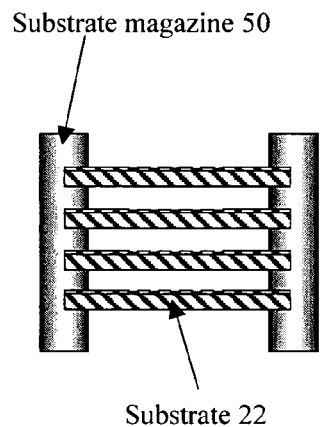
FIGS. 5a to 5i illustrates the steps of the exemplary substrate processing process of FIG. 4.
Figure 5B:
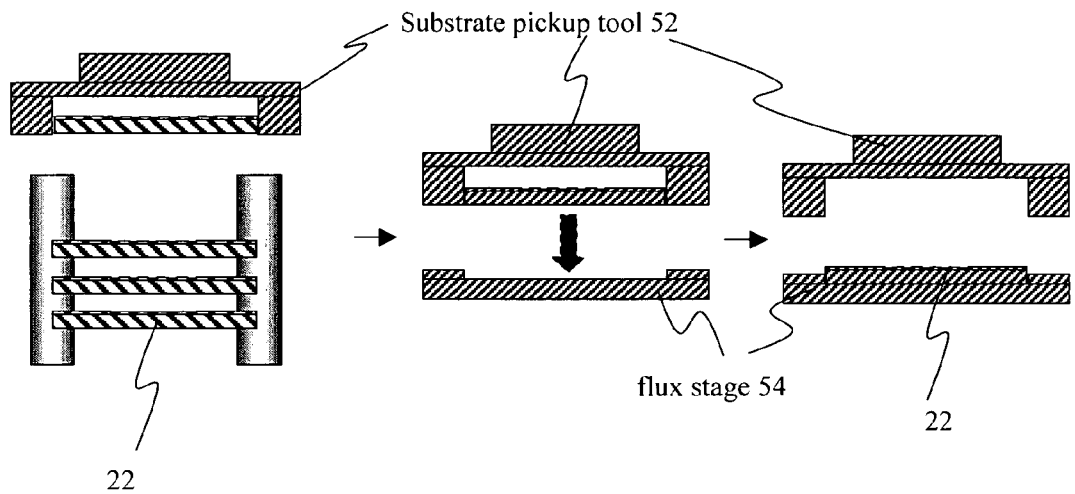
Figure 5C:
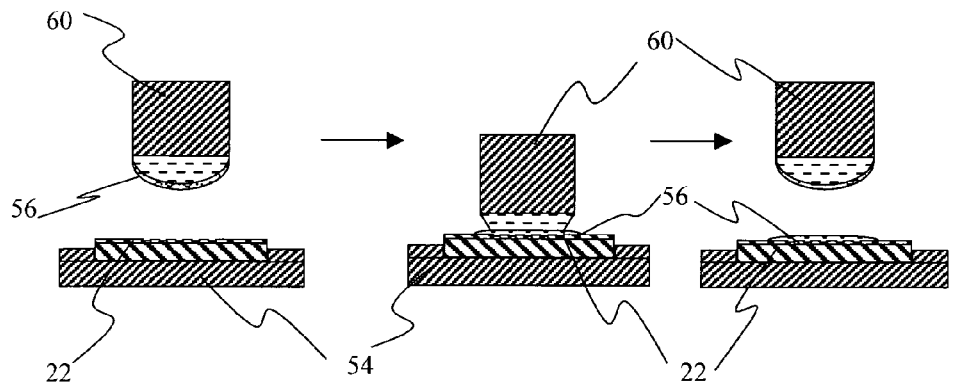
Figure 5D:
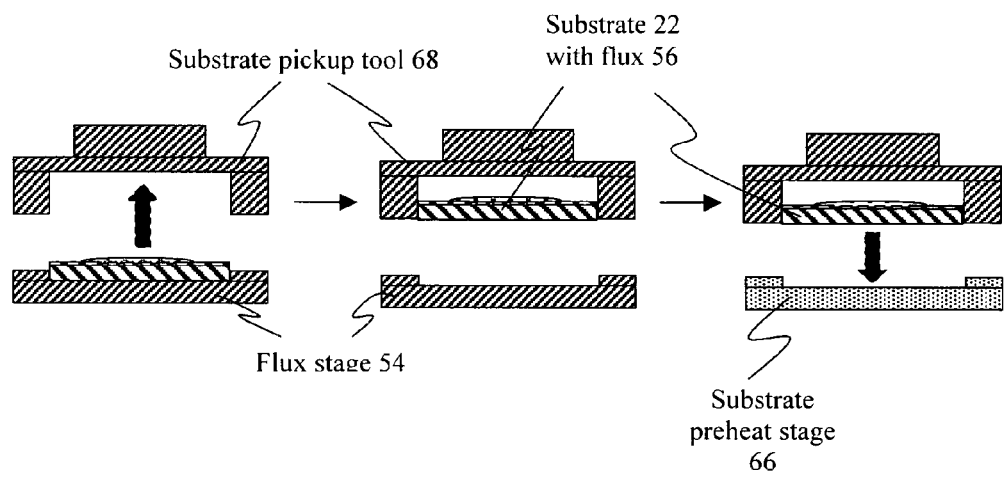
Figure 5E:
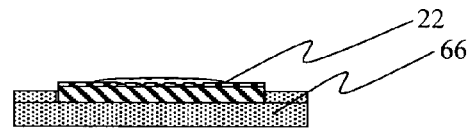
Figure 5F:
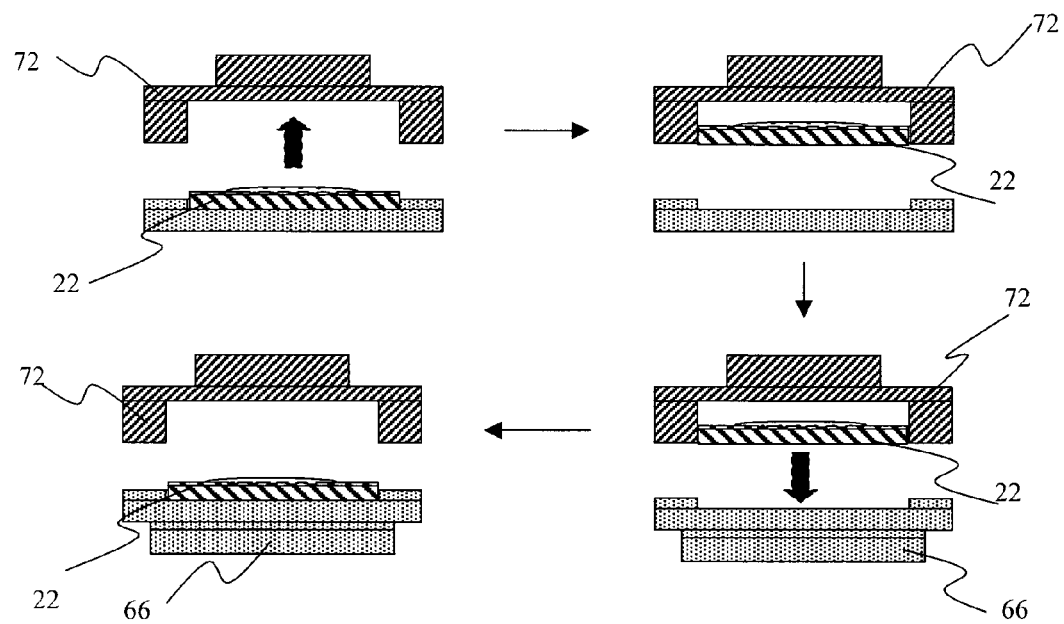
Figure 5G:
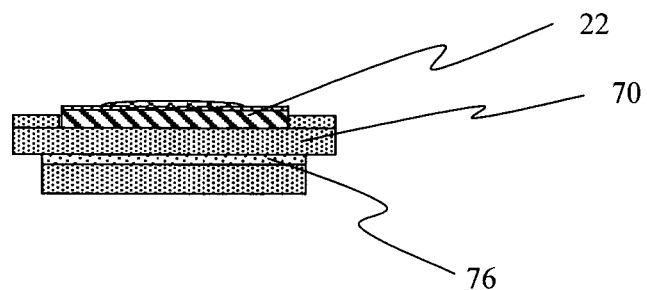
Figure 5H:
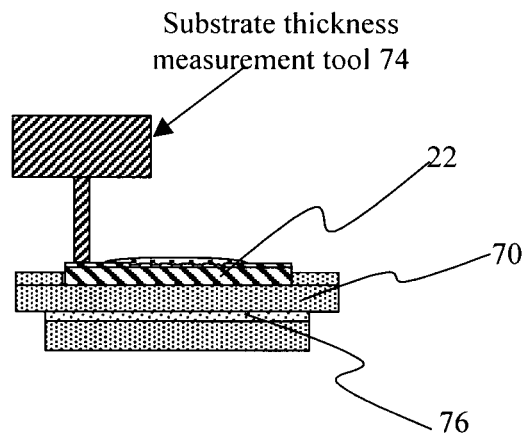
Figure 5I:
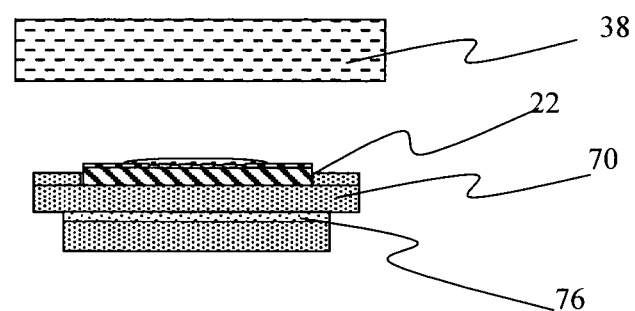

The system 600 further comprises the substrate thickness measurement tool 74, as shown in FIG. 5h for measuring the thickness or height of the substrate 22. It will be understood by a person skilled in the art that alternative means or mechanisms may be used for measuring the thickness or height of the substrate 22.

Figure 17:
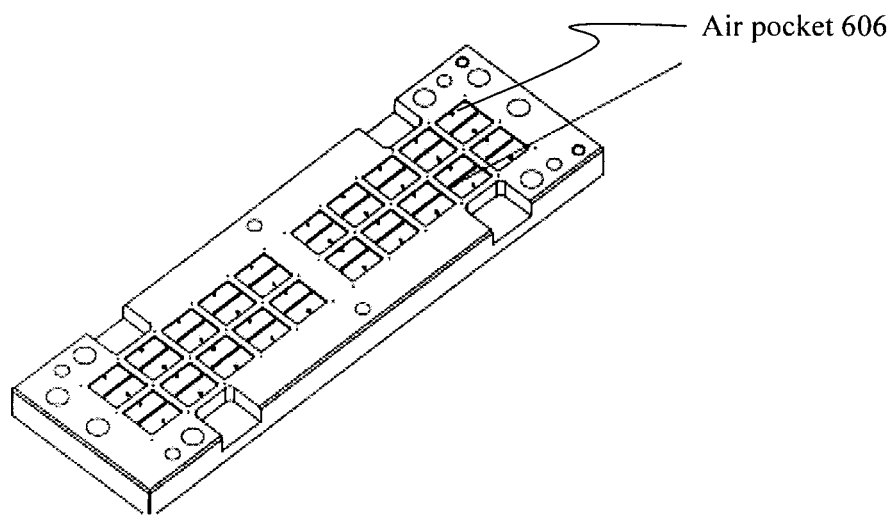
FIGS. 17 and 18 show partial isometric views of exemplary bond stages of the exemplary system of FIG. 16.
Figure 18:
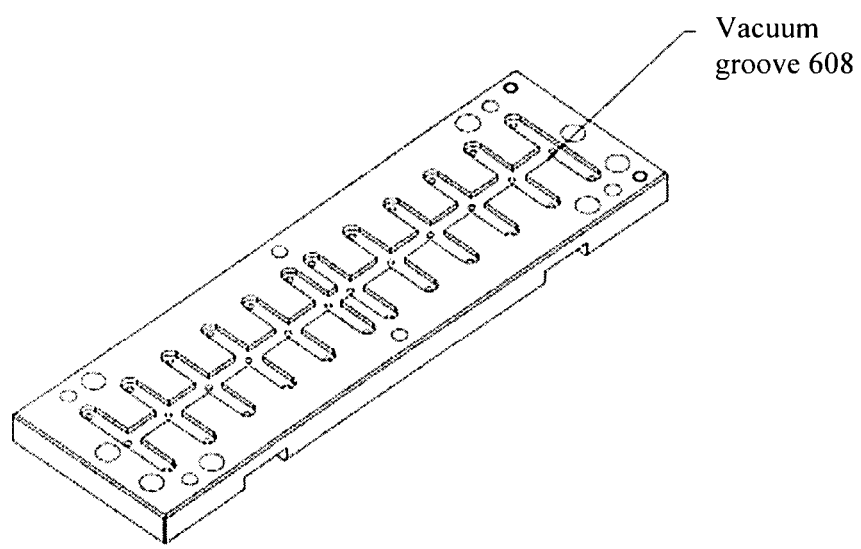

The system 600 further comprises heating means, elements or device for preheating the substrate 22 in the step 350, and for further heating the substrate 22 to the substrate process temperature in the step 370. Preferably, the substrate 22 is heated by the bond stage 70 to the substrate process temperature. The bond stage 70 is designed and constructed for facilitating thermal management thereof, and of the substrate 22 positioned thereon. FIG. 17 and FIG. 18 show exemplary bond stage 70 designs. The bond stage 70 can comprise air pockets 606 for facilitating heat retention within (i.e. prevent heat dissipation from) the substrate 22. The bond stage 70 preferably comprises vacuum grooves 608. The vacuum grooves 608 facilitate application of vacuum or suction for securing the substrate 22 to the bond stage 70. The shape and position of the vacuum grooves 608 is predetermined so as not to coincide with positions of copper traces present on the substrate 22.

It is important that the system 600 is equipped and designed for thermal management of the each of the semiconductor chip 12 and the substrate 22 during the method 100. More specifically, the system 600 comprises means or mechanisms for thermal management of the semiconductor chip 12 and the substrate 22 during the exemplary bonding process 500. Thermal management may be facilitated by use of one or more of computer software programs and manual or mechanical input as known to a person skilled in the art. The system 600 preferably enables the solder portions 20 on the bump structures 16 to be maintained in the molten state before the semiconductor chip 12 is displaced towards the substrate 22 to thereafter enable bond formation between the bump structures 16 and the bond pads 64 of the substrate 22.

Figure 19:
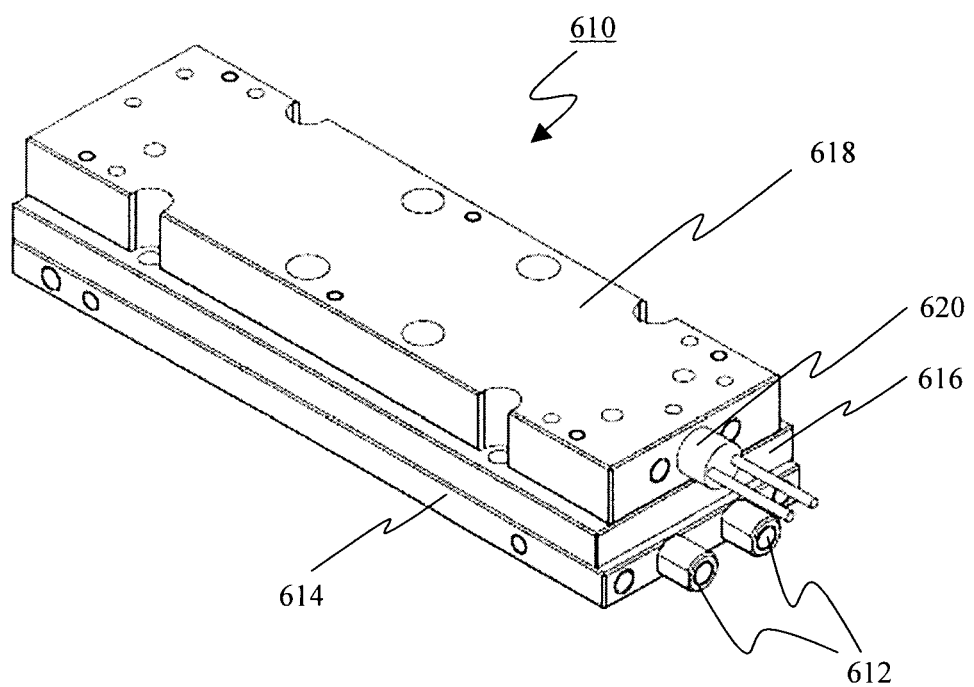
FIG. 19 shows a partial isometric view of the water cooling mechanism of the exemplary system of FIG. 16.

The system 600 further comprises a water cooling mechanism 610 as shown in FIG. 19. The water cooling mechanism 610 comprises a pipe connector extension 612, a chiller plate 614, a substrate table base insulator 616, a hot plate 618 and a cartridge heater 620. Preferably, the water cooling mechanism 610 can be coupled to the bond stage 70 for at least one of facilitating insulation and cooling thereof. In other words, the water cooling mechanism 610 preferably facilitates thermal management of the bond stage 70.

It will be appreciated by a person skilled in the art that the system 600 further comprises means for performing the steps of the exemplary bonding process 500. Preferably, the system 600 comprises the second vision lens 38, also known as the look-up/look-down camera for aligning the semiconductor chip 12 relative the substrate 22 in the step 510 of the exemplary bonding process 500. More specifically, the second vision lens 38 facilitates accurate aligning of the bump structures 16 of the semiconductor chip 12 with reference to the bond pads 64 of the substrate 22. It will be understood by a person skilled in the art that alternative alignment means or mechanisms may be utilized by the system 600 for aligning the bump structures 16 formed on the semiconductor chip 12 with the bond pads 64 formed on the substrate 22.

In addition, the system 600 enables careful or accurate management of bond distance between the semiconductor chip 12 and the substrate 22. The system 600 comprises means for controlling at least one of speed and displacement magnitude of each of the first phase movement and the second phase movement of the bond tool 36 towards the bond stage 70 in the steps 520 and 530 respectively. Control or management of displacement magnitude of the bond tool 36 towards the bond stage 70 preferably depends on the actual stroke valve calculated by the exemplary formula shown in FIG. 10. In other words, the calculation of thickness or height of each of the semiconductor chip 12 and the substrate 22 enables management of the displacement magnitude of the bond tool 36 towards the bond stage 70 during the steps 520 and 530, as well as the bond distance between the semiconductor chip 12 and the substrate 22. Preferably, the displacement magnitude of the bond tool 70 towards the bond stage 70 during the steps 520 and 530 positions the bump structures 16 of the semiconductor chip 12 in contact with the bond pads 64 on the substrate 22.

The system 600 further comprises means for offloading the formed flip-chip semiconductor package 10 during the step 140. As previously described, the flip-chip semiconductor package 10 is preferably cooled on the offload stage (not shown). As described above, it will be understood by a person skilled in the art that the system may comprise alternative cooling means and mechanisms may be used for cooling the formed flip-chip semiconductor package 10. For example, the system 600 can comprise a fluid system for effecting forced cooling of the flip-chip semiconductor package 20. Control of the cooling of the formed flip-chip semiconductor package 10 may be facilitated by use of at least one of computer software and manual or mechanical means as known to a person skilled in the art.

As previously mentioned, it will be understood by a person skilled in the art with the disclosure provided by the present description that the means, components or elements of the system 600 may be varied while still enabling performance of the steps 110 to 140 of the method 100. This is to say, the components, tools or apparatuses of the system 600 used for performing the steps of method 100 and the steps of each of the processes 200, 300, 400 and 500 may be varied, shaped, dimensioned and configured as required using techniques known to a person skilled in the art.

In the foregoing manner, an exemplary method 100 and system 600 for fabricating flip-chip semiconductor packages provided by the present invention is described. Various alterations or modifications to the exemplary method 100 and system 600 are also described above, and will be understood by a person skilled in the art to be within the scope of the present invention. It will also be understood by a person skilled in the art that the present invention is not limited to specific forms, arrangements or structures of the embodiments described above. It will be apparent to a person skilled in the art in view of this disclosure that numerous changes and/or modifications can be made without departing from the scope and spirit of the invention.

The invention claimed is:

1. A method for device packaging, the method comprising:
heating a semiconductor device to a first temperature, the semiconductor device comprising a plurality of bump structures, each of the plurality of bump structures comprising a solder portion, the first temperature being at least the melting temperature of the solder portion of each of the plurality of bump structures to bring the solder portion to a molten state;
heating a substrate to a second temperature, the substrate comprising a plurality of contact pads, the semiconductor device and the substrate disposed at a distance from each other during heating thereof to the first and second temperatures respectively;
spatially aligning the plurality of bump structures with the plurality of contact pads;
determining a distance between the semiconductor device and substrate; and
displacing the semiconductor device and the substrate relative to each other across a displacement distance that includes the determined distance subsequent the heating of the semiconductor device and the substrate for abutting the solder portion of each of the plurality of bump structures with a corresponding one of the plurality of contact pads, wherein the displacement distance comprises the determined distance and a compression offset value.

2. The method as in claim 1, wherein determining the distance between the semiconductor device and the substrate comprises measuring at least one of a semiconductor device thickness and a substrate thickness.

3. The method as in claim 1, wherein the compression offset corresponds to a coplanarity variance between the semiconductor device and the substrate.

4. The method as in claim 1, further comprising:
terminating the displacement of the semiconductor device and the substrate relative to each other upon abutment of the solder portion of each of the plurality of bump structures with a corresponding one of the plurality of contact pads.

5. The method as in claim 4, wherein the determination of the distance between the semiconductor device and the substrate facilitates a controlled termination of the displacement of the semiconductor device and substrate relative to each other.

6. The method as in claim 5, wherein the controlled termination of the displacement of the semiconductor device and substrate relative each other prior manages an application of pressure onto at least one of the semiconductor device and the substrate.

7. The method as in claim 1, wherein heating the substrate comprises:
heating the substrate to a second temperature, the second temperature being lower than the first temperature.

8. The method as in claim 7, wherein the second temperature is lower than the melting temperature of the solder portion of each of the plurality of bump structures.

9. The method as in claim 8, wherein heating the semiconductor device to the first temperature comprises:
heating the semiconductor device to a third temperature, the third temperature being lower the melting temperature of the solder portion of each of the plurality of bump structures: and
gripping the semiconductor device with a gripper tool, the gripper tool for heating the semiconductor device to the first temperature.

10. The method as in claim 9, wherein heating the semiconductor device to a third temperature comprises:
displacing the semiconductor device across a plurality of heating elements, the heating elements being operated for generating a heat profile thereacross, the heat profile being controlled for gradual heating of the semiconductor device to the third temperature.

11. The method as in claim 10, wherein heating the semiconductor device to a third temperature further comprises:
disposing the semiconductor device on a plate, the plate being displaceable for displacing the semiconductor device across the plurality of heating elements.

12. The method as in claim 11, wherein heating the semiconductor device to a third temperature further comprises:
displacing the semiconductor device in one of rotationally and linearly for disposing the semiconductor device on the plate in a required orientation; and
determining height of the semiconductor device with reference to a datum defined by the plate.

13. The method as in claim 8, wherein heating the substrate to a second temperature comprises:
disposing the substrate on a first holder, the first holder for heating the substrate to a fourth temperature, the fourth temperature being lower the second temperature; and
disposing the substrate on a second holder subsequent the substrate reaching the fourth temperature, the second holder for heating the substrate to the second temperature.

14. The method as in claim 13, further comprising:
depositing fluxing agent onto the plurality of contact pads when the substrate is disposed on the first holder, the second temperature being lower than the activation temperature of the fluxing agent.

15. The method as in claim 14, further comprising:
depositing at least one underfill material onto the plurality of contact pads when the substrate is disposed on the first holder, the second temperature being lower the curing temperature of underfill material.

16. The method as in claim 1, wherein determining the distance between the semiconductor device and the substrate comprises:
determining a height of the semiconductor device; determining a height of the substrate; and referencing the heights of the semiconductor device and substrate with a datum subsequent the heating of the substrate to the second temperature.

17. The method as in claim 16, wherein spatially aligning the plurality of bump structures with the plurality of contact pads comprises:
- defining a first coordinate system on the semiconductor device and a plurality of reference axes intersecting and configuratively corresponding with the plurality of bump structures;
- defining a second coordinate system on the substrate and a plurality of reference vertices coinciding and configuratively corresponding with the plurality of contact pads of the substrate; and
- aligning the first coordinate system with the second coordinate system for substantially coinciding each of the plurality of reference axes with a corresponding one of the plurality of reference vertices to thereby spatially align the plurality of bump structures with the plurality of contact pads.

\* \* \* \* \*